United States Patent [19]

Behlen

[11] Patent Number: 5,351,047

[45] Date of Patent: Sep. 27, 1994

[54] DATA DECODING METHOD AND APPARATUS

[75] Inventor: Frederick M. Behlen, Chicago, Ill.

[73] Assignee: Laboratory Automation, Inc., Chicago, Ill.

[21] Appl. No.: 948,409

[22] Filed: Sep. 21, 1992

[51] Int. Cl.⁵ .............................................. H03M 7/40
[52] U.S. Cl. ....................................... 341/67; 341/81
[58] Field of Search ....................... 341/65, 67, 81, 106

[56] References Cited

U.S. PATENT DOCUMENTS

| | | |
|---|---|---|
| 3,675,212 | 7/1972 | Raviv et al. . |
| 3,716,851 | 2/1973 | Neumann . |
| 3,918,047 | 11/1975 | Denes ................. 341/67 |
| 3,921,143 | 11/1975 | Woodrum . |
| 4,021,782 | 5/1977 | Hoerning . |
| 4,420,771 | 12/1983 | Pirsch . |
| 4,464,650 | 8/1984 | Eastman et al. . |
| 4,475,174 | 10/1984 | Kanayama . |
| 4,563,671 | 1/1986 | Lim et al. . |
| 4,593,267 | 6/1986 | Kuroda et al. . |
| 4,647,908 | 3/1987 | Ross et al. ............... 341/67 |
| 4,730,348 | 3/1988 | MacCrisken . |
| 4,749,983 | 6/1988 | Langdon, Jr. . |
| 4,899,149 | 2/1990 | Kahan .................... 341/67 |
| 4,937,573 | 6/1990 | Silvio et al. ............. 341/67 |
| 4,963,867 | 10/1990 | Bertrand ................. 341/60 |
| 5,001,478 | 3/1991 | Nagy . |
| 5,016,009 | 5/1991 | Whiting et al. . |
| 5,021,782 | 6/1991 | Perron et al. . |
| 5,045,853 | 9/1991 | Astle et al. . |
| 5,055,841 | 10/1991 | Cordell .................. 341/67 |
| 5,060,242 | 10/1991 | Arbeiter ................ 375/122 |
| 5,126,739 | 6/1992 | Whiting et al. . |
| 5,138,316 | 8/1992 | Konishi ................... 341/67 |
| 5,173,695 | 12/1992 | Sun et al. ................ 341/67 |
| 5,181,031 | 1/1993 | Tong et al. .............. 341/65 |

*Primary Examiner*—Marc S. Hoff
*Attorney, Agent, or Firm*—Laff, Whitesel, Conte & Saret

[57] ABSTRACT

A high-speed decoder is disclosed which operates on variable word length data, but accepts an incoming compressed data stream comprising a series of fixed length tokens, each of which can represent one or more pixels. The decoder comprises a translation unit which, in any given decoding cycle, decodes one pixel, and which forwards any remaining information available in the current token, but not used to decode the current pixel, for use in decoding the next pixel. The translator unit, which is table driven, is not required to explicitly shift or align the remaining data, nor is it required to explicitly determine the length of the current pixel before decoding the next. The high speed of the decoder derives from parallel decoding using the table-lookup method, combined with the absence of bit-shifting delays in the feedback critical path. The decoder employs a modified, truncated Huffman coding method which enables the decoding hardware to operate at up to 33 million pixels per second. Such fast cycle times are achieved in part by eliminating the bit-shifting operations previously required for aligning VWL codeword data.

7 Claims, 26 Drawing Sheets

Conditions                                   Code Table Address

Case 0: Prefix: 0
Prefix data bits: n/a
Prefix data value: n/a
Length of table segment: 256
Word address of table segment: 0

```
14 13 12 11 10 9 8  7 6 5 4 3 2 1 0
 0  0  0  0  0 0 0 |      Token      |
```

Case 1: Prefix: 1
Prefix data bits: 0
Prefix data value: n/a
Length of table segment: 256
Word address of table segment: 256

```
14 13 12 11 10 9 8  7 6 5 4 3 2 1 0
 0  0  0  0  0 0 1 |      Token      |
```

Case 2: Prefix: 2 + x
Prefix data bits: 1
Prefix data value: 0 < x < 1
Length of table segment: 512
Word address of table segment: 512

```
14 13 12 11 10 9 8  7 6 5 4 3 2 1 0
 0  0  0  0  0 1 | x |    Token      |
```

Case 3: Prefix: 4 + x
Prefix data bits: 2
Prefix data value: 0 < x < 3
Length of table segment: 1024
Word address of table segment: 1024

```
14 13 12 11 10 9 8  7 6 5 4 3 2 1 0
 0  0  0  0  1 |  x  |    Token      |
```

Case 4: Prefix: 8 + x
Prefix data bits: 3
Prefix data value: 0 < x < 7
Length of table segment: 2048
Word address of table segment: 2048

```
14 13 12 11 10 9 8  7 6 5 4 3 2 1 0
 0  0  0  1 |    x    |    Token      |
```

Case 5: Prefix: 16 + x
Prefix data bits: 4
Prefix data value: 0 < x < 15
Length of table segment: 4096
Word address of table segment: 4096

```
14 13 12 11 10 9 8  7 6 5 4 3 2 1 0
 0  0  1 |      x      |    Token      |
```

Case 6: Prefix: 32 + x
Prefix data bits: 5
Prefix data value: 0 < x < 31
Length of table segment: 8192
Word address of table segment: 8192

```
14 13 12 11 10 9 8  7 6 5 4 3 2 1 0
 0  1 |        x        |    Token      |
```

Case 7: Prefix: 64 + x
Prefix data bits: 6
Prefix data value: 0 < x < 63
Length of table segment: 16384
Word address of table segment: 16384

```
14 13 12 11 10 9 8  7 6 5 4 3 2 1 0
 1 |          x          |    Token      |
```

FIG. 9

| Byte No. | byte 1 | byte 2 | byte 3 | | byte 4 | | | byte 5 |
|---|---|---|---|---|---|---|---|---|
| | 7 6 5 4 3 2 1 0 | 7 6 5 4 3 2 1 0 | 7 6 5 4 3 2 1 0 | 7 6 5 4 3 2 1 0 | 7 6 5 4 3 2 1 0 | 7 6 5 4 3 2 1 0 | 7 6 5 4 3 2 1 0 | 7 6 5 4 3 2 1 0 |
| 930 { Token value | 1 1 1 0 1 0 0 0 | 0 0 0 0 0 0 1 1 | 0 0 1 1 1 1 0 0 | 1 1 0 0 | 0 0 0 0 | 0 0 0 0 | 0 0 0 0 | x x x x x x x x |
| 902 { Pixel No. | 1 | | 2 | 3 | 4 | 5 | 6 | 7 |
| 904 { Pixel value | 1030 | | 1030 | 1029 | 1030 | 1032 | 1032 | 1033 |
| 906 { Source symbol | 1030 | | 0 | −1 | +3 | 0 | 0 | +1 |
| 908 { Rel. or Abs. | Absolute | | Rel. | Rel. | Rel. | Rel. | Rel. | Rel. |
| | 910 | | 912 | 914 | 916 | 918 | 920 | 922 |

|  | INPUT | | | OUTPUT | | | | FINAL OUTPUT (neglecting pipeline delays) |
|---|---|---|---|---|---|---|---|---|
| STEP | Prefix | Token | Extd | Short (dec.) | Ext. (dec.) | Next Prefix | MODE E A M | |
| 1 | 0 | 11110100 | 6 | 1024 | 1030 | 0000001 (8-bit table) | 1 1 0 | 1030 |
| 2 | 1 | 00011110 | n/a | 0 | n/a | 1011110 (14-bit table) | 0 0 0 | 1030 |
| 3 | 1011110 | 00000010 | n/a | −1 | n/a | 0001100 (11-bit table) | 0 0 1 | 1029 |
| 4 | 0001100 | 00000010 | n/a | +3 | n/a | 0000000 (7-bit table) | 0 0 1 | 1032 |
| 5 | 0 | 00000010 | n/a | 0 | n/a | 0100010 (13-bit table) | 0 0 0 | 1032 |
| 6 | 0100010 | X | n/a | 0 | n/a | 0001010 (11-bit table) | 0 0 1 | 1032 |
| 7 | 0001010 | X | n/a | +1 | n/a | 0000001 (8-bit table) | 0 0 0 | 1033 |

FIG. 11

DATA DECODING METHOD AND APPARATUS

BACKGROUND OF THE INVENTION

This invention relates to coding and decoding of digital data, and more particularly to methods and apparatus for rapidly decoding streams of encoded, packed, unaligned, variable-length code words.

Medical image data, when digitally encoded, usually contains a large amount of redundancy because the digital representation allows each pixel to assume any value independent of the value of neighboring pixels. However, in real images, the value of each pixel rarely differs from that of its neighbors by more than a small amount. Various other types of data acquired or sampled from real-world signals have similar characteristics. As a result, uncompressed data of this type requires unnecessarily large amounts of storage space, and requires an unacceptably long time to transfer via input-/output devices, communications channels, and the like.

In order to reduce the volume of this data, the approaches which are customarily used in the art employ such techniques as delta pulse code modulation (DPCM) and run length encoding to reduce the spatial correlation of the data, and employ variable word length (VWL) coding to compactly represent the decorrelated data. In these techniques, the fixed-length data are converted to variable-length codewords according to the statistics of the data. In general, the lengths of the codewords are chosen so that the most frequently occurring data are represented by shorter codewords, and infrequently occurring data are represented by longer codewords. As a result of properly assigning the variable-length codewords to the entire set of source symbols, the average codeword size of the VWL-encoded data is less than that of the original data, and thus compression is achieved.

Generally, the encoding process can be implemented by a table-lookup process using the decorrelated input data to address the table. Each entry of the table contains the output codeword and a data field specifying the codeword's length. The code length then controls subsequent hardware, such as an output shift register for a communications channel, or combinatorial bit-packing logic for output to fixed-word-length devices such as a computer or digital data storage system. A combinatorial method of this type employing a barrel shifter is described in Arbeiter U.S. Pat. No. 5,060,242.

Recovery of the original data, however, is slowed down by the decoding process, which is more complicated than the original coding process. Each VWL codeword must be extracted from the received bit stream before it is decoded into a source symbol Until the codeword is decoded, the starting bit position of the next codeword is not known. This limits the designer's ability to use multistage pipelined hardware to enhance throughput.

There are several methods of decoding VWL codewords. A traditional approach is to use a tree-searching algorithm. A VWL code can always be represented by a tree with codewords as leaves. The decoding process starts at the root of the treed and is guided to follow one of two branches at each node, according to the next bit from the input data stream. When a leaf is reached, the end of the codeword is detected. The most common hardware design for a tree-search decoder consists of a memory containing the decoding table, with a pair of entries for each node. The data bit being decoded is connected to the low order bit of the table address, and thus determines which branch of the tree will be selected at each node, i.e. which of the pair of entries will be selected in the current decoding step. Each of these entries has a one-bit data field identifying it as either a leaf or as a pointer to another node, and another data field containing either the decoded value (if a leaf) or (if not a leaf) the table address of the next pair of node entries. This hardware implementation requires a table lookup for each bit of the input bit stream, and is thus limited in its speed.

A table-lookup based approach is an alternative to the bit-by-bit tree search method. A table lookup approach is disclosed in Raviv et al. U.S. Pat. No. 3,675,212. In Raviv's approach, the received bit string is compared with the contents of a codeword table stored in an associative memory device. The Code table has an entry associated with each possible VWL codeword. Each entry includes the decoded fixed-length input word and the length of the variable length codeword. When the sequence of leading bits in an input register matches one of the entries of the codeword table, a codeword match is indicated. The input register is then shifted by the number of bits indicated by the code length entry, thereby making the next sequence of bits available for comparison with entries in the codeword table. Feedback to the input is required to inform the input register of the number of bits to shift after each variable length word is decoded.

A somewhat faster table-lookup decoding approach than Raviv's in described in Arbeiter U.S. Pat. No. 5,060,242. A combinatorial barrel shifter, rather than a shift register, is used to shift the input data into proper bit alignment for the decoding table.

In all of the above approaches, the feedback of the word length defeats attempts at pipelining the decoding process, and thus limits the speed of the decoder.

An alternative approach, which employs a feedforward technique, is described in Cordell U.S. Pat. No. 5,055,841. There the input bit stream enters a shift register at a fixed bit rate, and the parallel output of the shift register is connected to a programmable logic array (PLA) which functions as an associative memory device. The PLA is capable of decoding and translating the VWL code in each cycle of the shift register clock. The decoded output word is only transferred into the output latches, however, in the shift cycle when the VWL code is correctly aligned at the input to the PLA, as determined by a counter loaded with the length of the most recent VWL code. Due to the high speed of the PLA and the ability use delay-matching techniques in the feedforward signal paths, this method is fast. However, it still relies on decoding and decision-making on the time scale of the serial bit rate, and requires extremely fast components to keep up with the 155 Mhz bit rate specified for the high definition television application contemplated in the Cordell patent.

Due to the difficulty of implementing high-speed VWL decoders, there have been several special VWL codes designed for fast decoders. For example, a VWL code with a length-indicating prefix is proposed by J. Cocke et al. in U.S. Pat. No. 3,717,851. Such approaches trade off coding efficiency against hardware speed.

In many computer imaging applications, the speed at which images can be displayed is an important factor in achieving user acceptance. For example, where computer-based X-ray image display systems are employed in a medical environment to replace film images, users demand the ability to select, view and manipulate the images at least as rapidly as they could with ordinary film. Thus, in evaluating the application of a VWL decoder in a medical imaging workstation, it was determined that a decoding rate of at least 25 million pixels per second was desirable to meet the performance requirements of system users.

However, the practical limit to the decoding rate for the serial tree searching technique is about 40–50 million bits per second using present bipolar and CMOS semiconductor technology. At an average of 6 bits per pixel, this amounts to only 7–8 million pixels per second. Even using a lookup table and a commercially available barrel shifter to decode Huffman codes, as described in Arbeiter, a decoding rate of approximately only 15 million pixels per second is achievable.

Thus, prior art decoding techniques which use commercially feasible technology fail to satisfy system performance requirements. Although some fast decoders are available, they either require special codes which provide poor data compression efficiency, or they require exotic components which are too expensive for the intended commercial applications.

OBJECTS AND SUMMARY OF THE INVENTION

It is therefore an object of the present invention to provide apparatus and methods for decoding variable-word-length Codes which achieve higher decoding rates than prior-art techniques, while maintaining high compression efficiency.

It is another object of the present invention to provide apparatus and methods for decoding variable-word-length codes which achieve high decoding rates while avoiding the need to explicitly realign input data to coincide with predetermined data boundaries in the decoding hardware.

It is a further object of the present invention to provide apparatus and methods for decoding variable-word-length codes which achieve high decoding rates while avoiding the need to explicitly shift input data.

It is a further object of the invention to provide a decoder for use in a medical imaging workstation which decodes pixels stored in variable word length codes at a user-acceptable rate.

A high-speed decoder for operating on variable word length data constructed according to the present invention accepts an incoming compressed data stream comprising a series of fixed length tokens, each of which can represent one or more pixels. The decoder comprises a translation unit which, in any given decoding cycle, decodes one pixel, and which forwards any remaining information available in the current token, but not used to decode the current pixel, for use in decoding the next pixel. The translator unit is table driven. The translator unit is not required to explicitly shift or align the remaining data.

In a preferred embodiment, the token length is eight bits. The token can be optionally followed by an arithmetic suffix of the same fixed length. The remaining information contained in the previous token is retained for use in the next decoding cycle in a prefix word. The bits of the token, together with the bits of the prefix word, address a decoding table. The output data of the decoding table consists of the decoded source symbol, the prefix to be fed back to the table input in the next cycle, and control bits that govern the interpretation of the code.

The use of the prefix enables variable-length data elements to be carried in fixed-length tokens. If a token has more than enough information to encode a data element, the unused information may be passed on in the prefix to be used in conjunction with the next token. If a token, together with the prefix, has enough information to encode two pixels, then the input token stream will be frozen for one cycle as both pixels are output.

If more than one token is required to represent a pixel, an extended code comprising the token and an arithmetic suffix is used. The decoding hardware substitutes the data bits of the suffix for the lower bits of the source symbol from the decoding table.

According to one aspect of the invention, a first-in-first-out memory system is provided which enables 0, 1 or 2 bytes to be taken from the input stream in any one clock cycle.

The high speed of the decoder derives from parallel decoding using a table-lookup method, combined with the absence of bit-shifting delays in the feedback critical path.

The present invention employs a modified, truncated Huffman coding method which enables the decoding hardware to operate at up to 33 million pixels per second, using conventional bipolar and CMOS semiconductor technology. The invention enables faster cycle times by eliminating the bit-shifting operations typically required in the prior art for aligning VWL codeword data.

BRIEF DESCRIPTION OF THE DRAWINGS

These and other features of this invention will be best understood by reference to the following detailed description of a preferred embodiment of the invention, taken in conjunction with the accompanying drawings, in which:

FIG. 9 is a diagram showing how addresses into the code table of the decoder of FIG. 1–3 are resolved using the encoding scheme of FIGS. 5–8;

FIG. 10 is a diagram showing an exemplary fragment of a data stream encoded according to the scheme of FIGS. 5–9;

FIG. 11 is a table showing the input data, certain intermediate values, and output data produced in the decoder 100 in the course of decoding the exemplary data stream of FIG. 10.

At the outset, an overview of the operation of the invention may be helpful in understanding the remainder of the description. FIG. 1 shows an exemplary application, in which a decoder 100 in accordance with this invention is used to re-convert digitally encoded, compressed images back into their original unencoded form for display to a user. The decoder 100 operates on encoded image data in the form of a stream of variable length bit strings representing a series of picture elements or pixels. The encoded image consists of a plurality of such pixels, each having an associated value which may be stored in the form of a binary digital code. Typically, the pixel's value indicates the luminosity of that pixel when the reconstructed image is displayed. For each pixel, a "source symbol" is produced indicating either the pixel's value, or the amount by which that pixel's value differs from the value of an adjacent pixel or group thereof.

Figure 1:
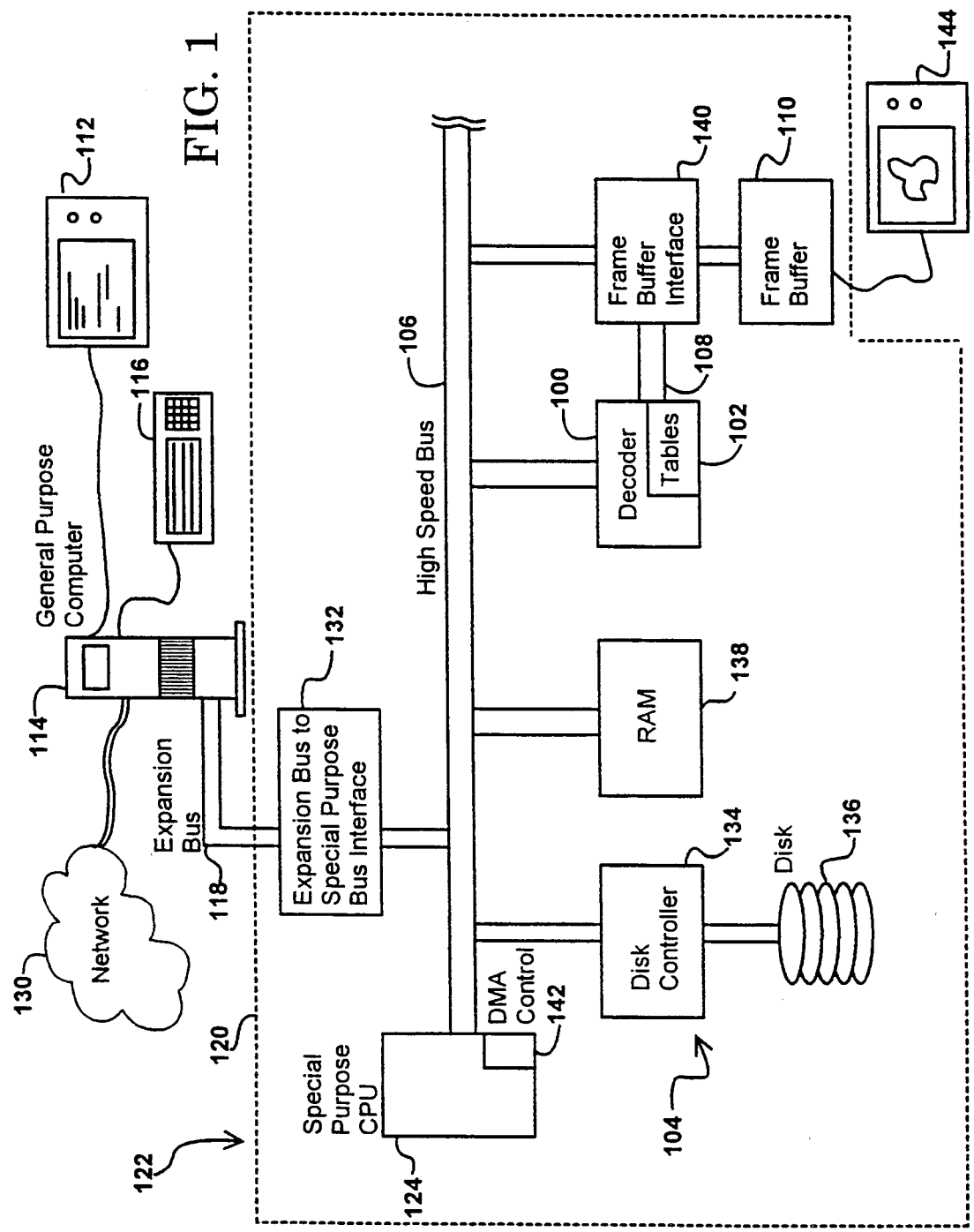
FIG. 1 is a system block diagram showing a data decoder constructed according to the present invention in a typical environment in which the invention may be applied.

To reduce storage space and data transfer times, each source symbol is subsequently encoded using a modified, truncated Huffman type coding method which results in data compression. The encoding process used in connection with this invention produces, for each source symbol, a "code word" consisting of a variable length bit string. In the specific embodiment of the invention disclosed herein the code words may range in length from 2through 14 bits, but the invention may be adapted to process larger code words. Adjacent code words are then concatenated and packed into one continuous bit stream which is then sliced into a long sequence of consecutive 8-bit bytes, which are referred to as "tokens". As a result of segregating the stream of variable length code words into fixed length tokens, many of the code words will span token boundaries, and some tokens will contain several code words. In spite of this non-alignment between code word boundaries and token boundaries, no padding is performed to align the code words on any particular data boundaries. The problem of identifying code word boundaries is solved, however, by making the code assigned for a specific source symbol vary according to the position within a token at which the code word is stored.

Since code words may span token boundaries, and since multiple code words may be packed into a token, it is highly likely that after any particular code word in a token is decoded, additional data (i.e. part or all of one or more additional code words) will remain in the token, and must be processed. A problem with prior art devices for decoding packed, variable length, encoded streams is that they generally have been constructed to ascertain the length of the code word presently being decoded, in order to determine the position within the present token at which any remaining data (i.e. the next code Word) begins. The prior art devices then shift this remaining data as necessary to realign it with a data boundary in the decoder hardware. The need to perform these steps separately introduces delay and hardware complexity.

According to one aspect of the invention, the decoder 100 advantageously avoids these problems by providing a translation means 264 (FIGS. 2A-2B) which, during each decoding cycle, decodes exactly one code word to produce:

a. a source symbol corresponding to the code word;
    b. a control word indicating how the decoder is to interpret that source symbol; and
    c. an additional "prefix" word containing any remaining information yet to be decoded in the present token, which relates to the next code word.

The prefix word (c) is then fed back to the input of the translation means 264 for direct use in the next decoding cycle, and need not be explicitly shifted or otherwise aligned. The fact that no such explicit shift or alignment need be performed saves processing time and reduces the complexity of the decoding hardware.

Thus, in each decoding cycle, the translation means 264 is presented with a token containing all, or a final portion of, a current code word to be decoded, along with the prefix word which was produced in the immediately previous decoding cycle. If any portion of the current code word appeared in the token processed in the previous cycle (i.e. if any bits remained after processing the previous code word), then the prefix word contains the unprocessed information from that cycle.

Hence, the prefix word enables the translation means to decode even those code words which span token boundaries, without using the multiple step process of determining the length or ending position of a previous code word and then shifting the current code word to align it in the decoder. As a result, the inventive decoder 100 advantageously produces an output source symbol (i.e. outputs a pixel) during each available decoding cycle whenever encoded input data is available.

In addition to the decoded source symbol and prefix word, the translation means 264 also produces a control word to indicate how the source symbol is to be further interpreted by the decoder 100 and to control whether or not the decoder requests additional bytes from the input stream for use in the next decoding cycle.

A source symbol may be treated as an absolute or relative quantity, depending upon the control word. If the current source symbol is to be treated as a relative quantity, the value of the current pixel is calculated by adding the value of the source symbol to that of the previous pixel. If the current source symbol is to be treated as an absolute quantity, the value of the current pixel is obtained from the source symbol without regard to the value of the previous pixel.

In addition, absolute source symbols may be treated as "short" or "extended" values, depending upon the control word. If the source symbol is a short absolute quantity, the pixel value is obtained exactly from the output of the translation means. If the source symbol is an extended absolute quantity, the pixel value is obtained by fetching an extension byte from the input stream and combining it with the upper bits of the output of the translation means.

The control word produced by the translation means also determines the number of additional bytes read from the input data stream by the decoder for use in the next decoding cycle. Ordinarily, one or two additional bytes are read from the input data stream, depending on the type of code word contained in the current token. For extended absolute code words, two bytes are required to replace the current token and the extension byte. For relative or short absolute code words, a single byte is generally needed.

However, if the current token, taken in conjunction with the current prefix word, contains sufficient information to decode more than one code word (i.e. contains sufficient information to represent more than one pixel), then it is not necessary to fetch the next token from the input stream until the decoder has decoded the final code word of the current token. Accordingly, when decoding code words prior to the final code word in a token, the translation means may produce a "multi-pixel" control word which inhibits subsequent fetches from the input data stream. However, for reasons which will be discussed later in detail, the translation means does not produce a "multi-pixel" control word unless seven or more bits remain to be decoded in the combined token plus prefix. If six or fewer bits remain, an additional byte is read from the input stream even if the current token and current prefix word contain sufficient information to decode more than one code word.

FIG. 1 is a system-level block diagram of an image data display system 122 which employs the data decoding method and apparatus of the present invention (which apparatus is hereafter referred to generally as the decoder 100), and is provided to show one example of the various image storing and display environments in which the invention may be used. In the exemplary image data display system 122, the inventive decoder 100 is used to convert image data from an encoded and compressed format, in which each pixel is represented by a bit string token of variable length, into a decoded or clear format, in which each pixel is represented by a fixed length binary value which can readily be shown on a conventional visual display device as part of a reconstructed image.

In prior art systems the binary value of each pixel directly represents the luminosity at which that pixel is intended to appear on the display device. Therefore, image data in the fixed word length pixel format may be essentially directly used by display control hardware to produce a visible image on the display device. However, image data in the conventional binary pixel format contains much redundant information, so that storage space requirements, as well as the time required to transfer the image data from storage media to the display equipment, are unacceptably large. In contrast, image data in the encoded token format used by the present invention requires substantially less storage space and transfer time, but cannot be directly used by conventional display devices. Accordingly, in this application, the inventive decoder 100 functions to rapidly decode the encoded image data so that the data may be used by the display control hardware at user-acceptable throughput rates.

The decoder 100 is adapted to operate in conjunction with a general purpose computer 114 which may have a keyboard 116, a display 112, and other suitable input and output devices, such as disk and tape drives (not shown), network equipment 130, and the like. The computer 114 preferably includes a general purpose system bus 118 across which data and control information may be exchanged at relatively low speeds. In addition, the general purpose computer 114 preferably also comprises a high-performance "embedded" computer system 122 to accommodate the high-speed transfer and display of large, high-resolution images. The dotted line 120 encircles elements of the embedded system 122 which would typically be realized as parts of the general purpose computer 114 (i.e., may reside in the same enclosure).

The embedded system preferably comprises the inventive decoder 100, a high-performance central processing unit 124, one or more storage devices 104, a frame buffer 110 with its associated interface 140, a large, high-speed memory 138, and an interface 132 to the general purpose bus 118 of the general purpose computer 114. Preferably, memory 138 includes at least 32 million bytes of high-speed RAM with an access time less than or equal to 80 ns. A very high-speed bus 106 is provided to interconnect the components of the embedded system. Another high-speed bus path 108 is provided between the decoder 100 and the frame buffer interface 140 to allow decoded images to be quickly loaded into the frame buffer memory.

In operation, image data which has been previously encoded and stored in the storage device 104 is passed sequentially to the decoder 100 via data bus 106. The decoder 100 decodes the image data and transfers the decoded data (i.e., the recovered original source pixels) via data path 108 to the frame buffer 110. The frame buffer 110 converts the decoded data into signals suitable for driving a display 144, such as a conventional CRT. The general purpose computer 114 performs interaction with system users, provides facilities for communication with external networks 130, and directs and coordinates the operation of the various components in a manner which is well known in the data processing art, except for the particulars of the decoding process hereinafter discussed.

As will be discussed later in detail, the decoder 100 includes a code table memory 102 whose contents specify the operation of the decoder—i.e., how the encoded data will be translated back into the original source data. Accordingly, means are provided in the decoder 100 and other system components to enable the code table memory 102 to be loaded, under control of embedded CPU 124, with contents suitable for decoding the compressed image information which will be presented to the decoder.

In a commercial embodiment of the invention, the computer 114 may be a suitable microprocessor-based personal computer of modern design, having substantial amounts of memory, secondary storage facilities, network interfaces, and other appropriate peripheral devices. The decoder 100 may be implemented as a portion of the embedded, special-purpose computer system, and may be constructed on one or more printed circuit cards (i.e. "expansion cards") which are adapted to be housed in the general purpose computer 114 and which are received in industry-standard "expansion slots" which enable these cards to interface with an industry-standard expansion bus conventionally provided in the computer. In such implementations, the industry-standard expansion bus of the computer would serve as the general purpose bus 118.

Although the storage device 104 is depicted in FIG. 1 as a disk storage system, it may instead comprise any suitable data storage device of adequate speed and capacity to store the encoded image data and rapidly transfer it to the decoder 100 upon demand. The capacity required of the storage device depends on the application; for example, in a medical imaging workstation used for storing and displaying high quality medical X-ray images, a total capacity of 2 gigabytes is adequate for many purposes. The local image storage capacity of the workstation may be supplemented by remote or network disk devices; preferably, images would be transferred to the local storage device 104 of the embedded system 122 prior to use.

In a commercial embodiment of the invention, storage device 104 is implemented as a hierarchical memory system using a large, fast disk drive 136 and controller 134 coupled to the large, high-speed RAM 138 of the embedded system 122. A portion of the embedded system RAM 138 is treated as a disk cache. Image files are read from the disk into the embedded system RAM 138 under control of the special purpose CPU 124 and then rapidly transferred to the decoder 100. The disk drive 136 and controller 134 employ any suitable wide, high-speed interface to the embedded system RAM 138, and preferably conform to a well-known, commercially standardized interface specification such as SCSI.

A high-performance microprocessor (CPU) 124 is used to control the decoder 100 and other components of the embedded system 122. The high-speed bus 106 may be a conventional 32-bit wide dedicated bus. Preferably, a high-performance direct memory access (DMA) controller 142 is provided which cooperates with CPU 124 to manage certain data transfers over the high-speed bus 106; the DMA controller 142 may be integrated with the CPU 124 but is preferably capable of operating in parallel therewith. In operation, either the CPU 124 or the DMA controller 124 reads blocks of data from the embedded system RAM 138 and rapidly transfers the data over the dedicated bus 106; the DMA controller 142 preferably manages such transfers while requiring a minimum of supervision by CPU 124. In a commercial embodiment of the invention, the CPU 124 may be a type 80960 microprocessor available from Intel Corporation of Santa Clara, Calif., but other processors could also be used.

Figure 2A:
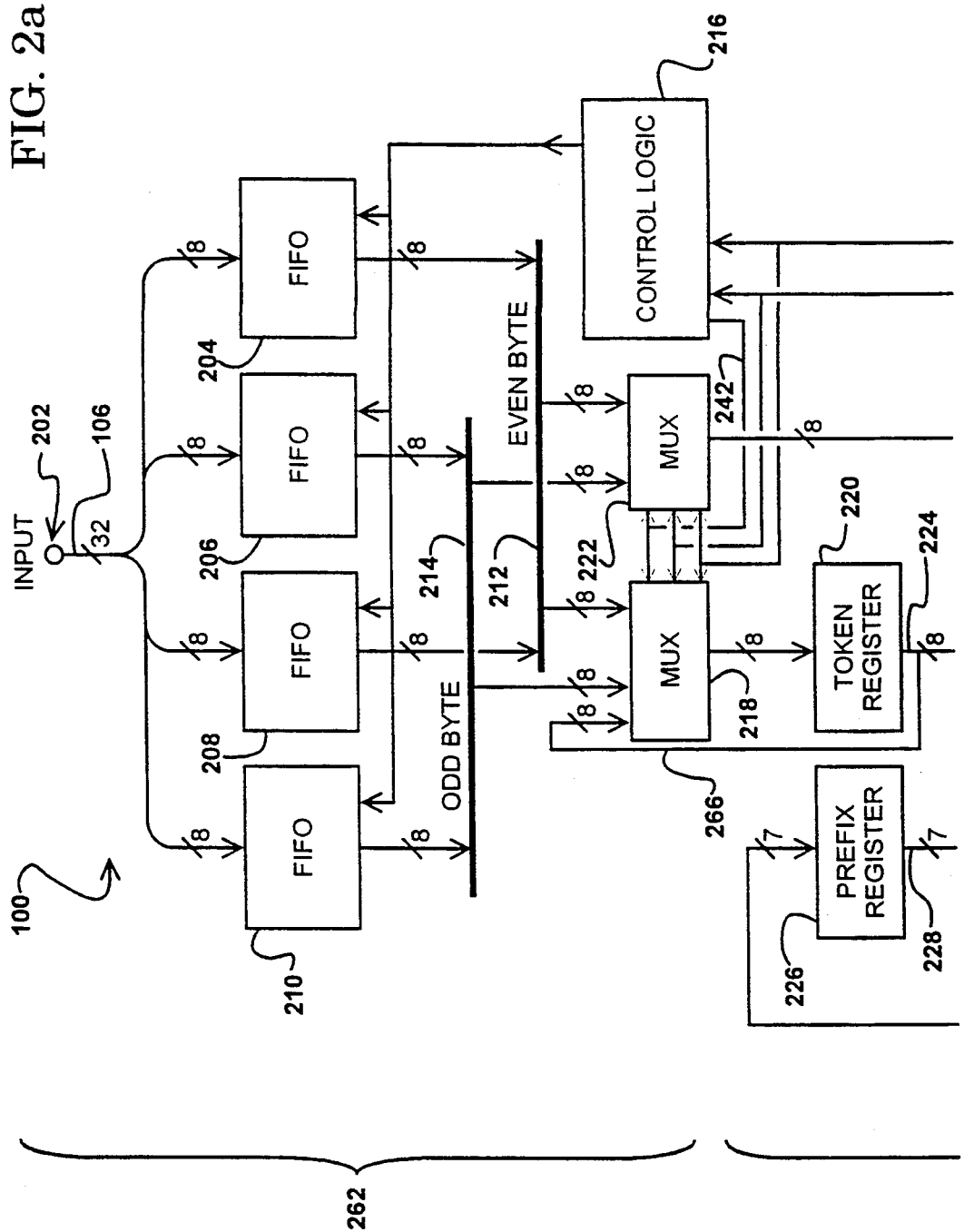
FIGS. 2A and 2B are a functional electrical block diagram showing the hardware design of a preferred embodiment of the data decoder.
Figure 2B:
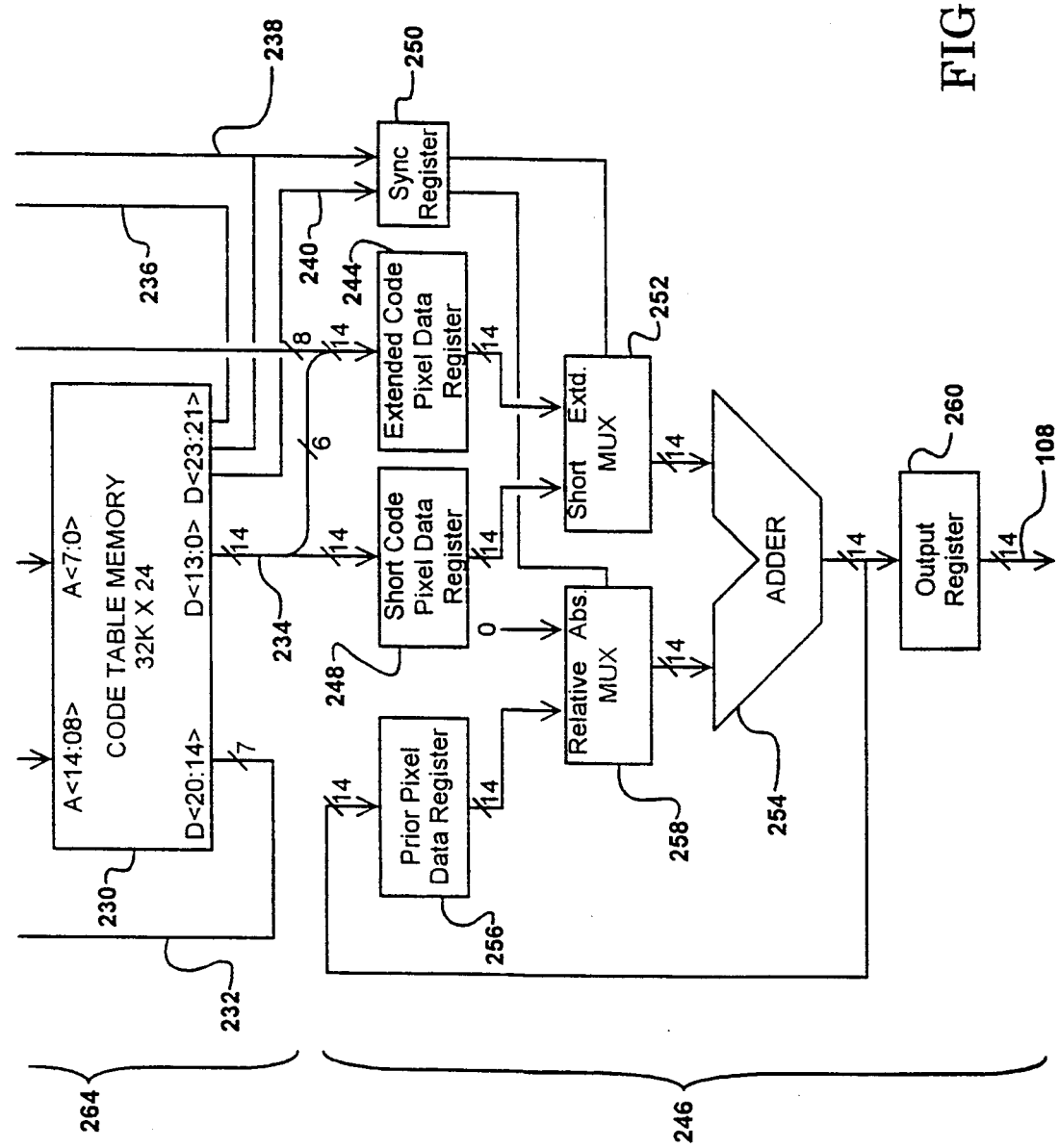
Figure 3A:
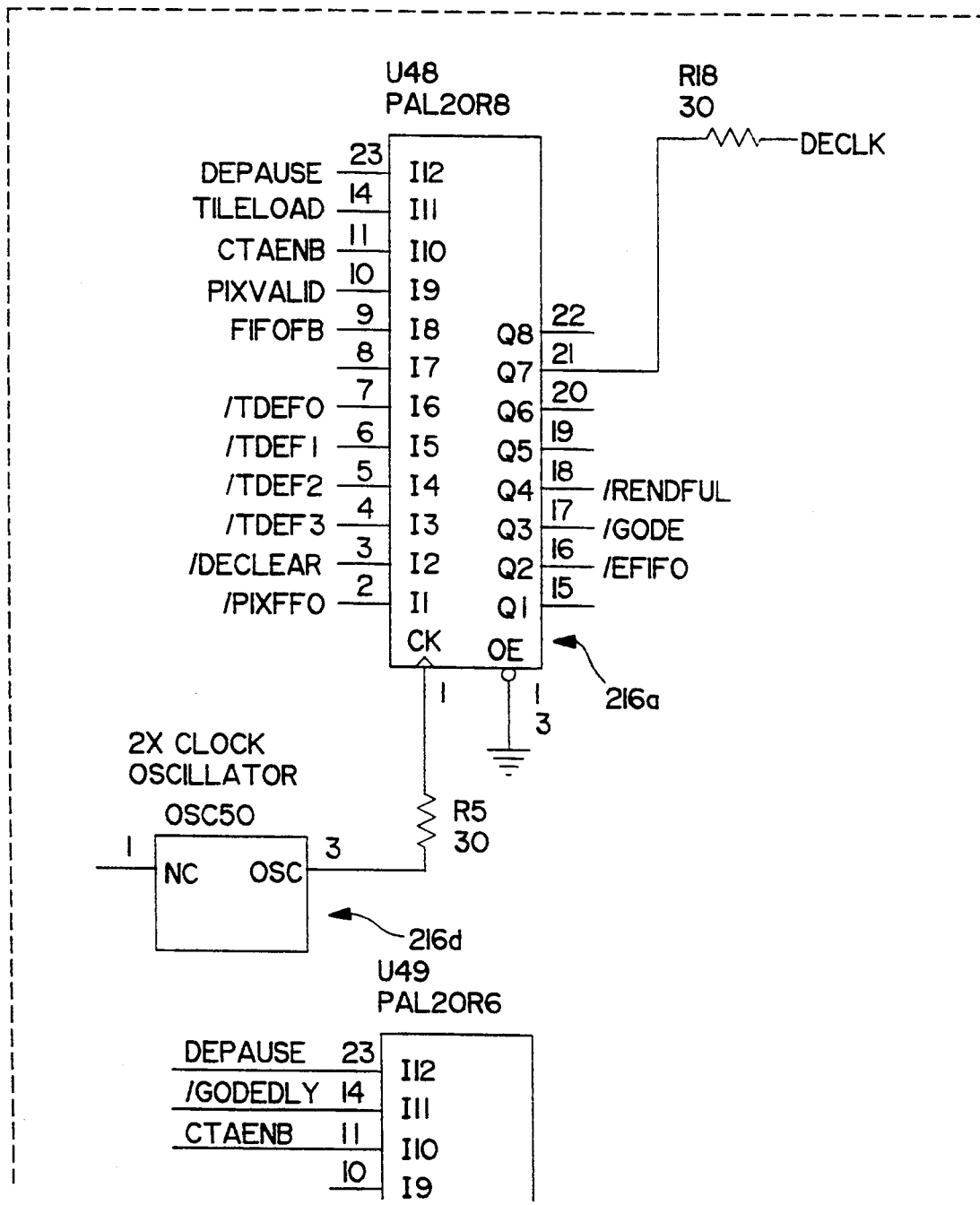
FIGS. 3A and 3K are a detailed electrical schematic diagram corresponding to the block diagram of FIGS. 2A and 2B.
Figure 3B:
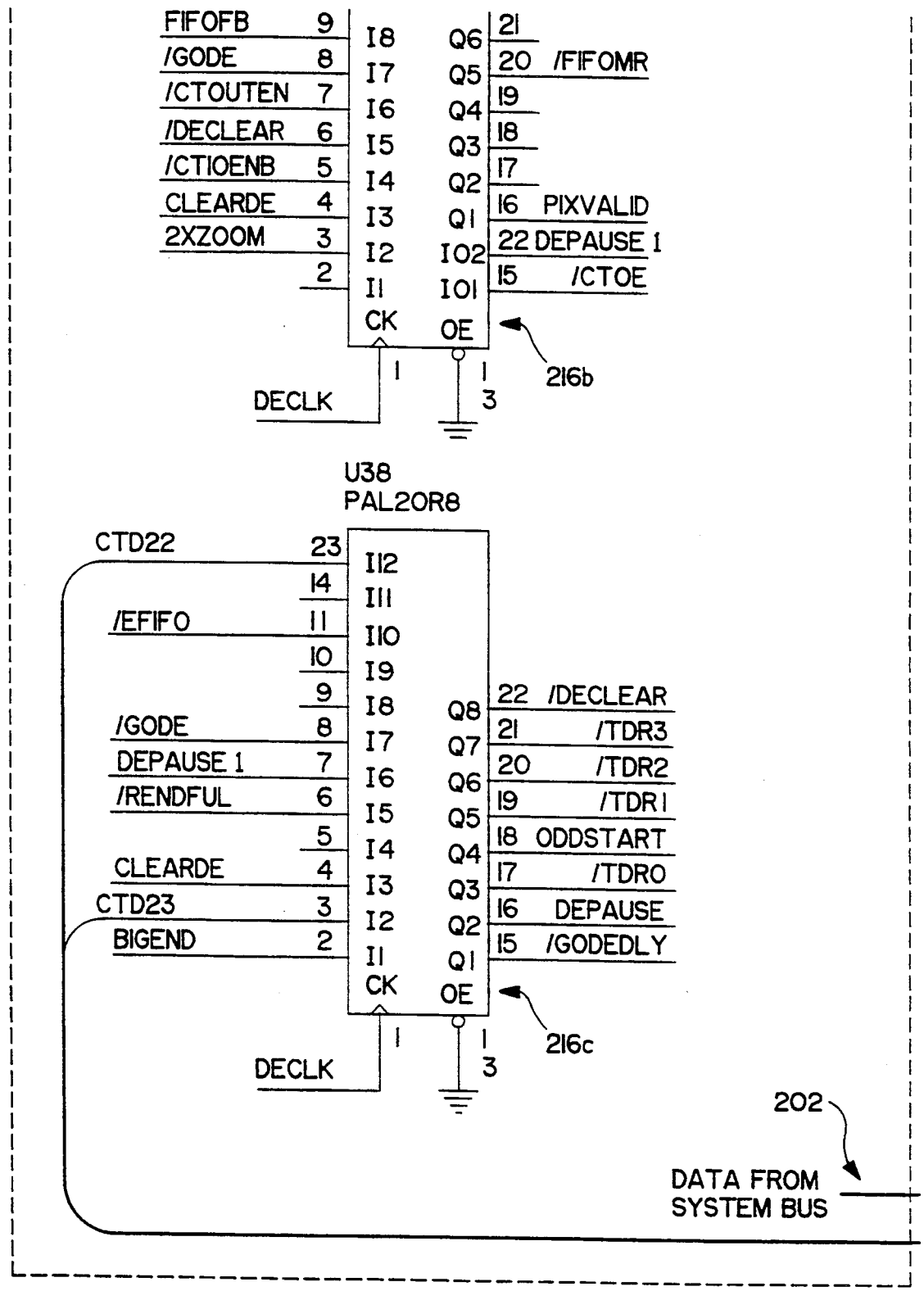
Figure 3C:
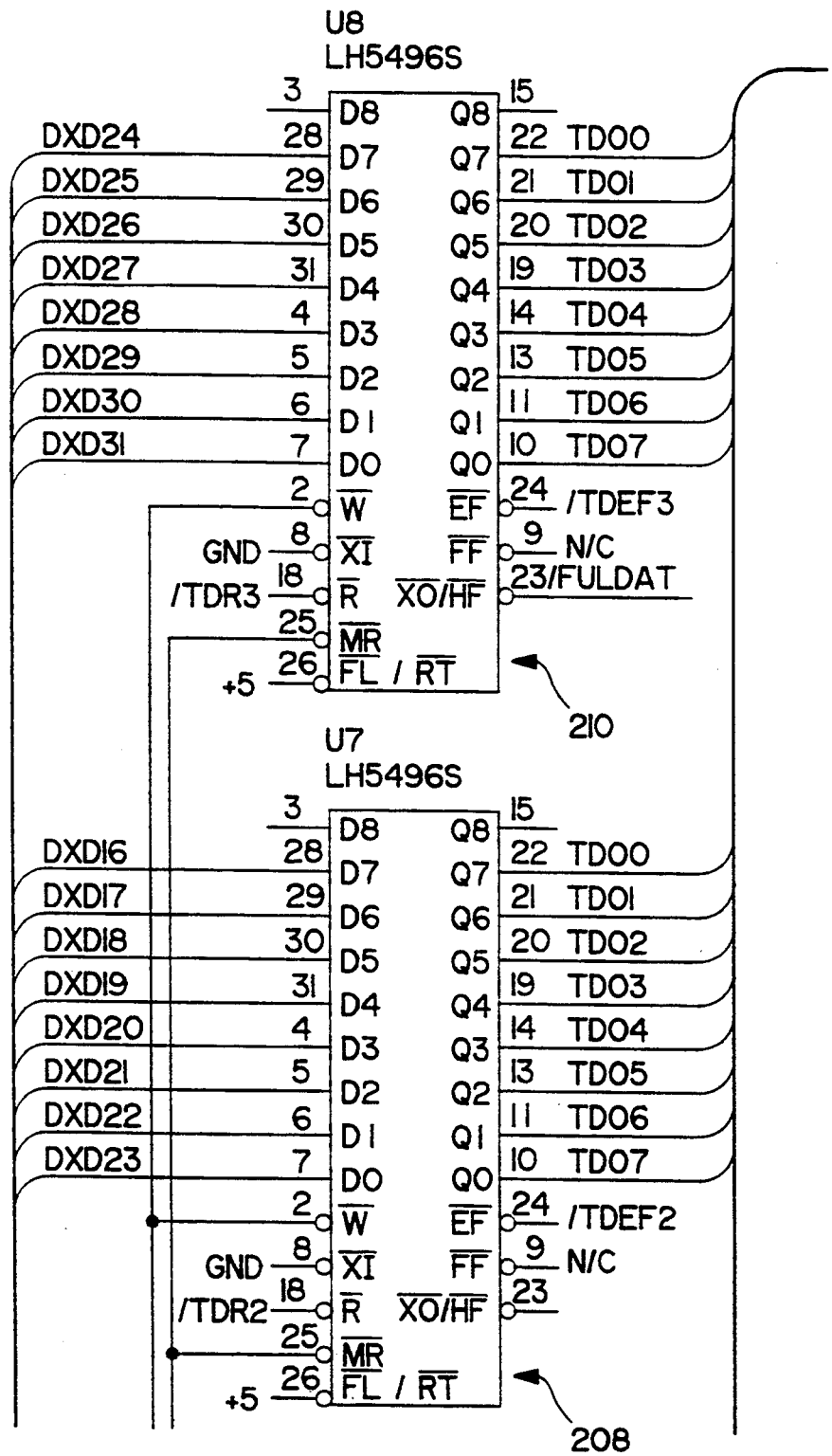
Figure 3D:
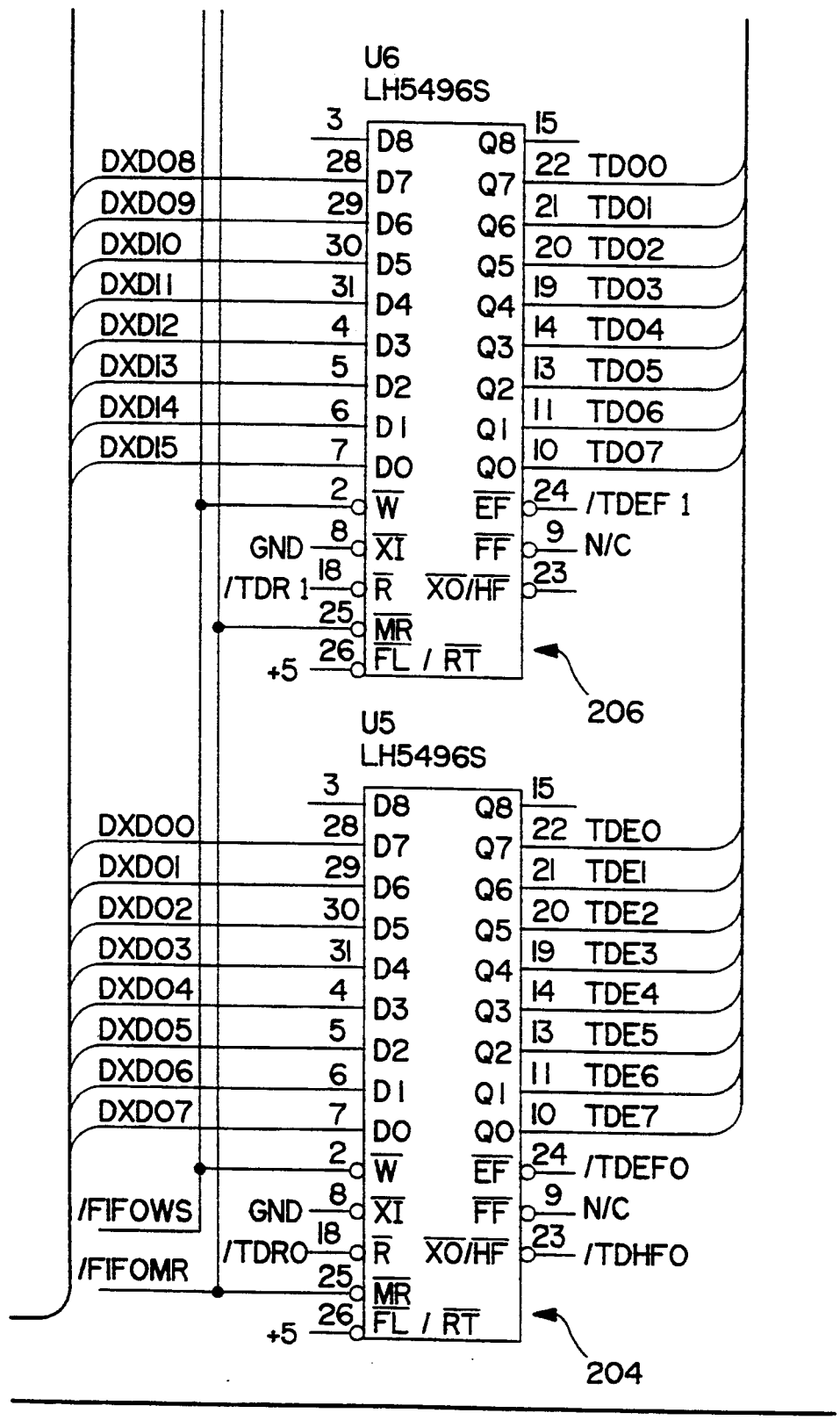

FIGS. 2A and 2B are a functional block diagram showing a hardware design for implementing a preferred embodiment of the data decoder 100. FIGS. 3A and 3K are a detailed electrical schematic diagram corresponding to the block diagram of FIGS. 2A-2B. Where possible, similar reference numbers are used to denote similar items in FIGS. 2A-2B and 3A-3B. There is not always a one-to-one correspondence, however, between elements of these two figures because the use of large-scale integrated circuits in the specific implementation of FIGS. 3A-3K sometimes allows multiple functions to be combined in a single integrated circuit package.

As best seen in FIG. 2A-2B, the decoder 100 may be conceptually divided into three main sections: an input bus interface and synchronization section 262; the code translator 264; and an arithmetic postprocessing and output section 246.

The input bus interface and synchronization section 262 comprises an input bus 202, 106, a set of four First-In First-Out data buffer devices 204, 206, 208, 210 (hereafter, FIFOs), an internal even byte bus 212, an internal odd byte bus 214, a token source selection multiplexer 218, an extended code source selection multiplexer 222, and a control logic unit 216.

The input bus 202, 106 is preferably a high-speed 32-bit bus and carries encoded pixel data to the decoder 100. As is known in the art, the input bus 202 may be directly connected to the data bus of the high-performance embedded microprocessor 124 of display system 122 (see FIG. 1), or it may be connected to a direct memory access (DMA) channel or other data channel means capable of high-speed block data transfers from the storage device 104 (FIG. 1).

FIFOs 204, 206, 208, and 210 are byte-wide devices and are each connected to a different segment of the input bus 202, 106. Therefore, each FIFO receives a different byte-wide segment of the 32 bit data words transferred over the input bus 202, 106. The 32-bit input as shown is "little endian", i.e., FIFO 204 receives the least significant (lowest-address) byte within the word, and FIFO 210 receives the most significant (highest-address) byte. The input, however, could be configured with a different width or byte order in a different application. FIFOs 204, 206, 208, 210 function as a buffer to synchronize the differing data rates of the input bus 202, 106 (on which data appears in bursts), with the data requirements of the decoder 100. FIFOs 204, 206, 208, and 210 may be implemented using any appropriate, byte-wide FIFO. For example, FIFOs 204, 206, 208, and 210 may be implemented using 8-bit by 512 FIFOs available from Sharp Electronics Corp., Mahwah, N.J. as part number LH5496.

The inputs of all four FIFOs 204, 206, 208, and 210 are clocked simultaneously. Additional conventional logic (not shown) inhibits the input of data from the input bus 202, 106 when the FIFOs are full. The outputs of the FIFOs 204, 206, 208, and 210 are clocked independently of each other, according to the input data requirements of the code translator section 264. In addition to buffering data from the input bus 202, 106, the FIFOs also function to sequentially select bytes from the input bus 202 and present them to the code translator section 264 as needed. In any particular decoding cycle, the data translator section 264 requires a current byte containing a token to be decoded, and the "next" byte from the input data stream, which may be used as an extension byte. When the next decoding cycle begins, the code translator section 264 may require either none, one, or two of the next succeeding bytes from the input stream.

Figure 12A:
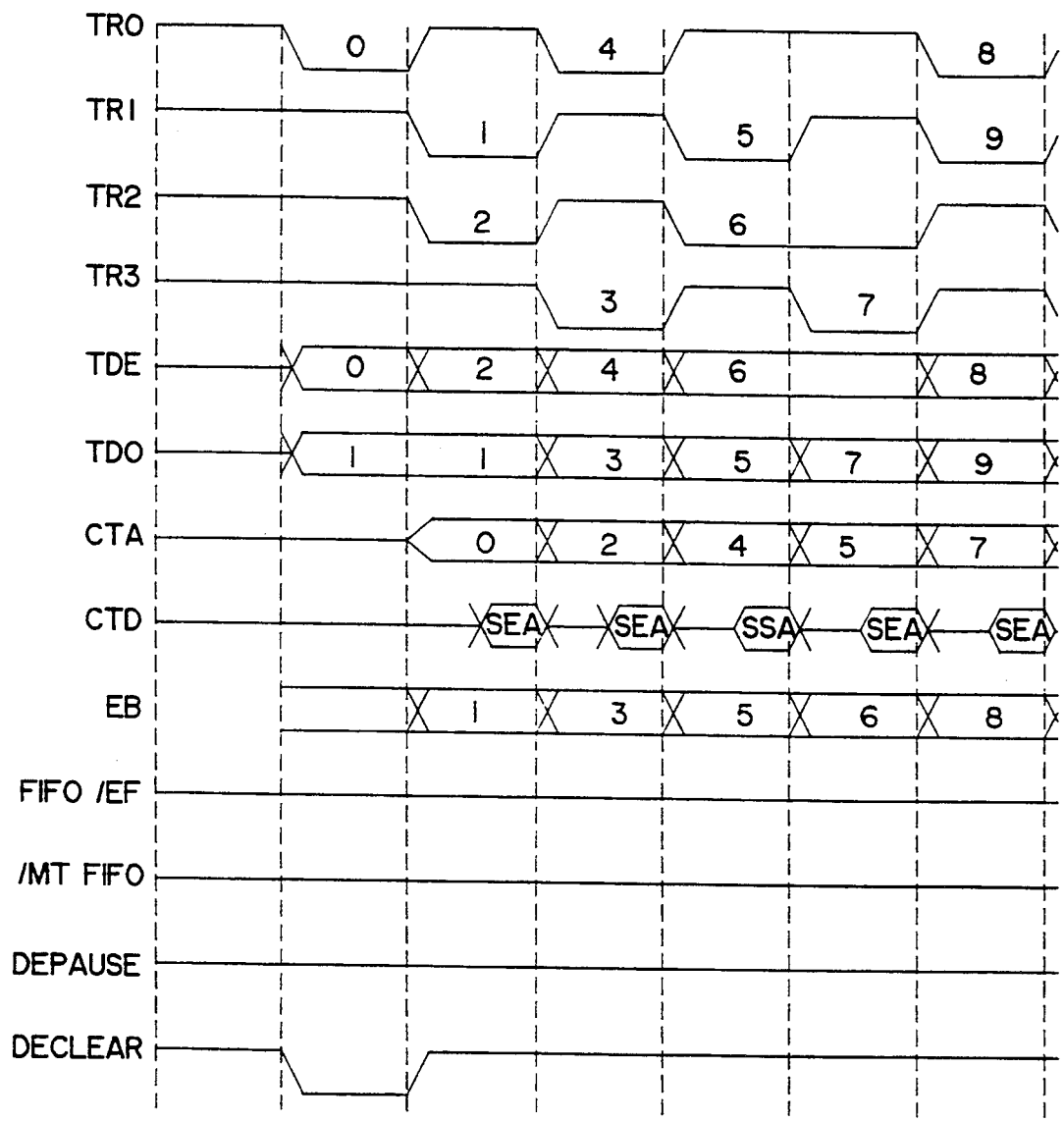
FIGS. 12A and 12D are an electrical timing diagram depicting the timing relationships of various signals within the decoder hardware implementation of FIGS. 3A-3K.
Figure 12B:
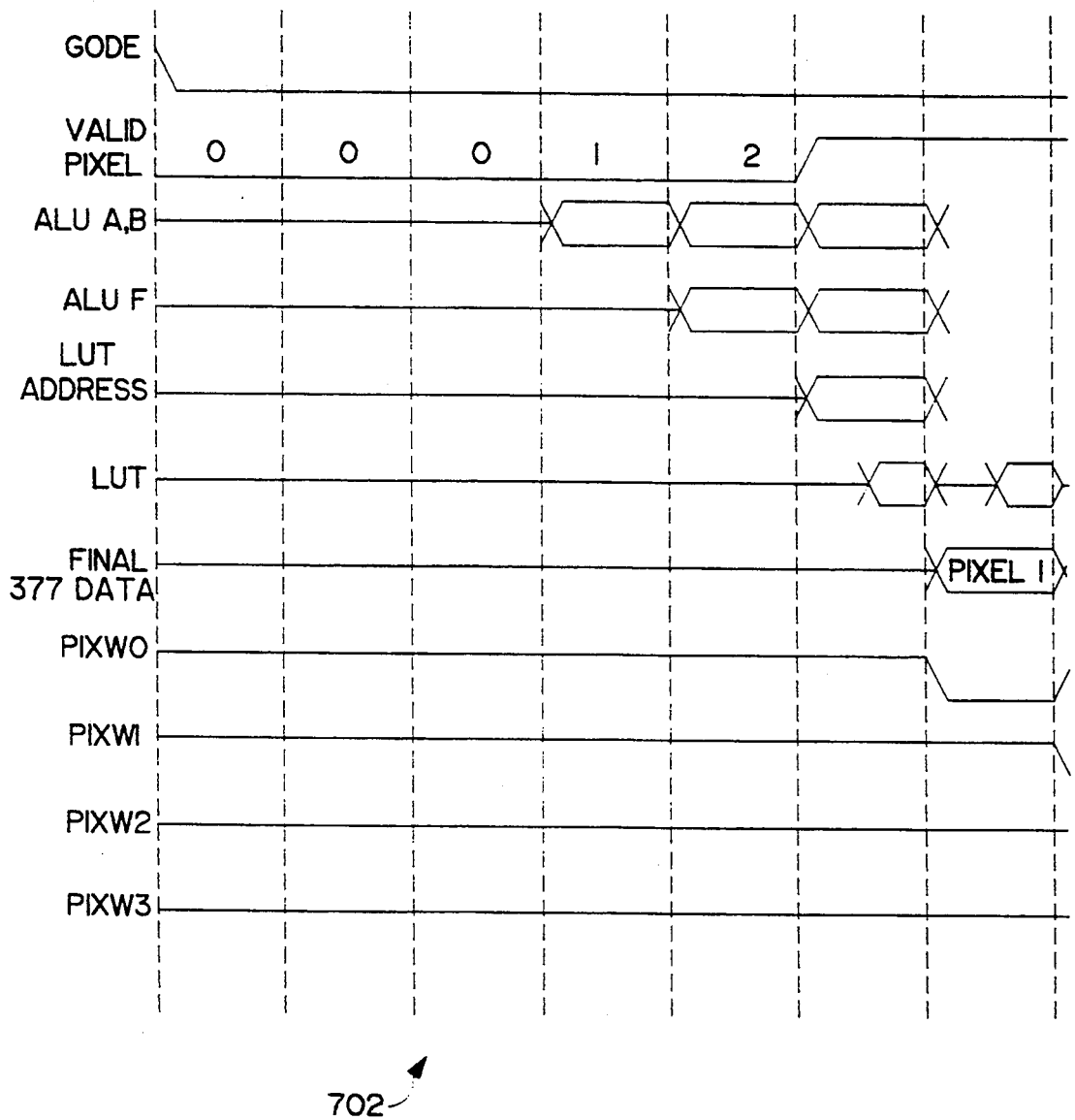
Figure 12C:
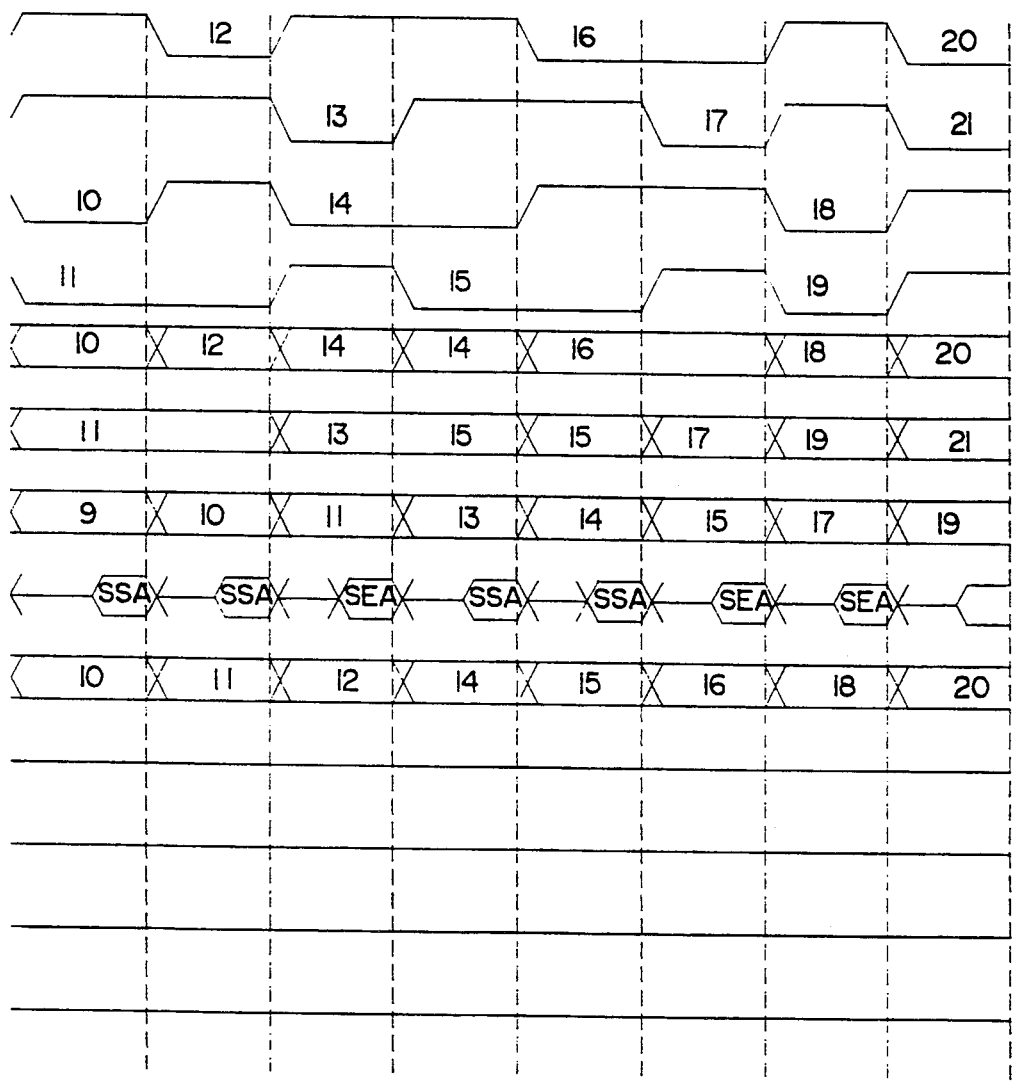
Figure 12D:
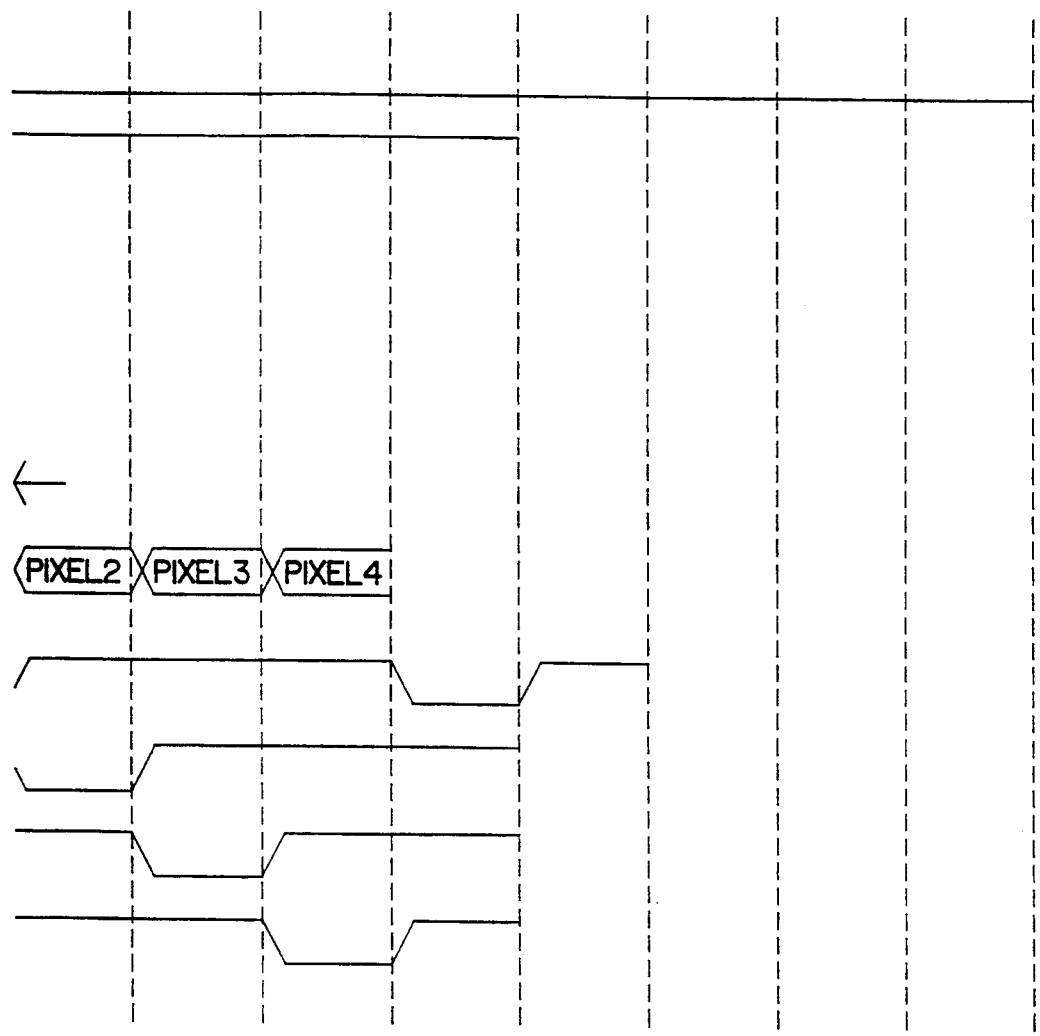

The output bytes are required sequentially (but in a round-robin, or odd-even alternating, fashion) from each byte-wide segment of the input bus 202, 106. Accordingly, the data outputs of FIFOs 204 and 208 are connected in common to the internal even byte bus 212. Likewise, the outputs of FIFOs 206 and 210 are connected in common to the internal odd byte bus 214. At any one time, the outputs of two of the FIFO devices are enabled at any one time, one onto the even byte bus 212 and one onto the odd byte bus 214. For example, as soon as an output data byte is taken from the even byte bus 212, the output of the active even FIFO is turned off and the next even byte is read from the other even FIFO device, and similarly for the two odd FIFO devices. The FIFO devices are thus continuously enabled in a "round robin" or odd-even alternating sequence. FIGS. 12A-12B an electrical timing diagram 702 depicting the timing relationships of various signals within the decoder, and in particular shows the operation of the FIFO devices and related components.

The code translator section 264 is clocked on a cyclical basis and, in general, demands new input data at the beginning of each cycle. A control logic unit 216, which may be implemented as logic devices 216a, 216b, 216c and clock oscillator 216d, provides the signals necessary for gating the inputs and outputs of FIFOs 204, 206, 208, 210 and for controlling multiplexers 218 and 222 which select the data sources from which the code translator section 264 is supplied. Logic devices 216a, 216b, and 216c may be suitable Programmable Array Logic (PAL) devices, such as type PAL20R8 and PAL20R6, which are commercially available from Advanced Micro Devices, Sunnyvale, Calif. or the equivalent from other suppliers. A set of suitable PAL equations for specifying the operation of logic devices 216a, 216b, and 216c are shown in Tables 1, 2, and 3, respectively.

At the end of any clock cycle when a particular token is being decoded, the next two bytes from the data stream are available on the internal even and odd byte buses 212 and 214, respectively. Multiplexer 218 selects the proper byte from the internal even and odd byte buses 212 and 214 for input to a token register 220. Multiplexer 222 selects the proper byte from buses 212, 214 to be supplied to the extended code pixel data register 244, which will be described in detail later.

The code translator section 264 of the inventive decoder receives byte-wide tokens containing code word information from the input bus interface and synchronization section 262. During each decoding cycle, the translator section 264 decodes exactly one code word, having a variable length of 2-14 bits, into a source symbol and supplies the decoded source symbol to the arithmetic postprocessing and output section 246. The translator section 264 also produces a prefix word which is used to carry forward any information bits in the current token which were not needed to decode the current code word, for use in the next decoding cycle. In addition, the translator section 264 produces a control word which determines how the decoded source symbol will interpreted to produce an output word, and determines the number of additional bytes to be read from the input data stream for use in the next decoding cycle.

The code translator section 264 comprises a token register 220, the token register source selection multiplexer 218, a prefix register 226, and a code table memory 230. Although multiplexer 218 has been discussed previously as a part of the input bus interface section 262, its function is also integral to the code translator section 264 and therefore may also be considered a part of the translator section.

The code table memory 230 is used to contain tables which control the decoding of code words into source symbols. Prior to operation of the decoder 100, the code table memory 230 must be loaded with suitable code tables corresponding to the coding scheme originally used to encode the image data. Accordingly, the decoder 100 preferably comprises conventional means (not shown) for loading the code table memory 230 under control of either the CPU of the general purpose computer 114 or the CPU 124 of the embedded system 122 (see FIG. 1). The internal structure of a set of code tables suitable for use in the code table memory 230 of the decoder 100 is discussed hereinafter in greater detail.

In a preferred embodiment of the invention, the code table memory 230 is used to decode truncated Huffman-encoded code words which vary in length from 2 to 14 bits, and produces output source symbols having a fixed length of 14 bits. For this particular application, code table memory 230 is preferably a 32 k word by 24 bit memory. Accordingly, the code table memory 230 has 15 address bits and 24 data bits.

However, the invention may be adapted to produce an embodiment which will accommodate other code word and source symbol lengths. It is believed that, in general, in an application in which the inventive decoder 100 is to decode code words of maximum length L to produce source symbols of length S, a memory having a word length of $S+L-4$ bits and $L+1$ address bits (i.e. $2^{(L+1)}$ words) would be adequate. As best seen in FIG. 3g and 3h, the code table memory 230 may be implemented using three suitable 32 k×8 bit static RAM devices 230a, 230b, 230c. For example, RAM devices 230a, 230b, and 230c may be type 62832 CMOS RAM integrated circuit devices, or their equivalent, having a maximum access time of 15 nS. Suitable RAM devices are available from Hitachi America, Ltd., Brisbane, Calif. and from other manufacturers.

As noted previously, multiplexer 218 selects the source of the token data to be clocked into the token register 220 at the beginning of each decoding cycle. The inputs of the multiplexer 218 are connected to both the even and odd internal data buses 212 and 214. The output of the multiplexer 218 is connected to the input of the token register 220. The output 224 of the token register 220 is supplied to the eight low-order address inputs of the code table memory 230. The multiplexer 218 and token register 220 receive control signals from the control logic 216 on lead 242 and from the code table memory on leads 236, 238 which determine whether the multiplexer 218 reads additional data from the internal buses, and, if it does, from which of the internal buses 212, 214. Data path 266 supplies the output signal 224 of the token register 220 to an input of multiplexer 218. When it is desired that the token register 220 retain its data from a previous decoding cycle for use in the next cycle, multiplexer 218 reads token register output data from data path 266.

Figure 3E:
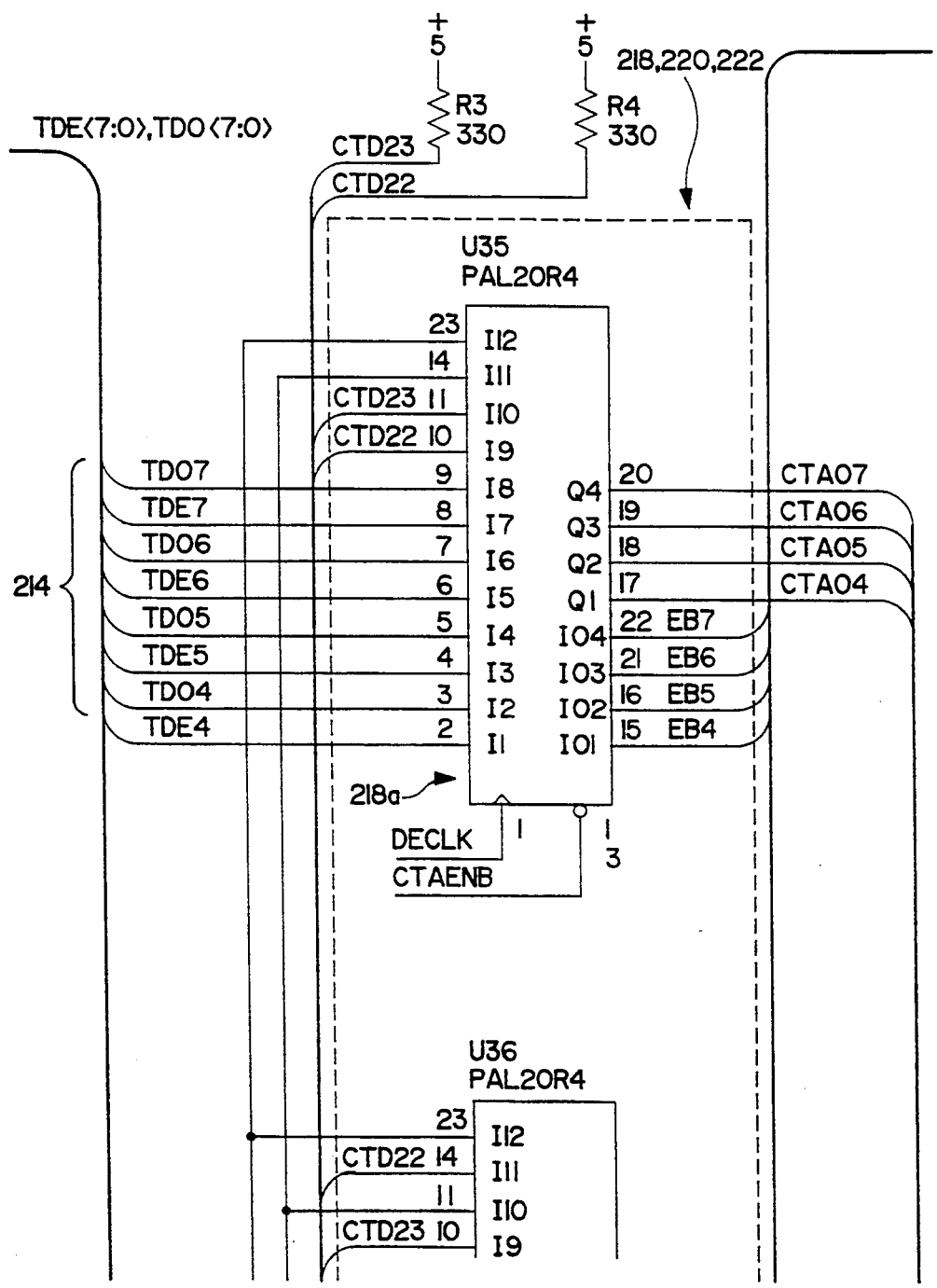
Figure 3F:
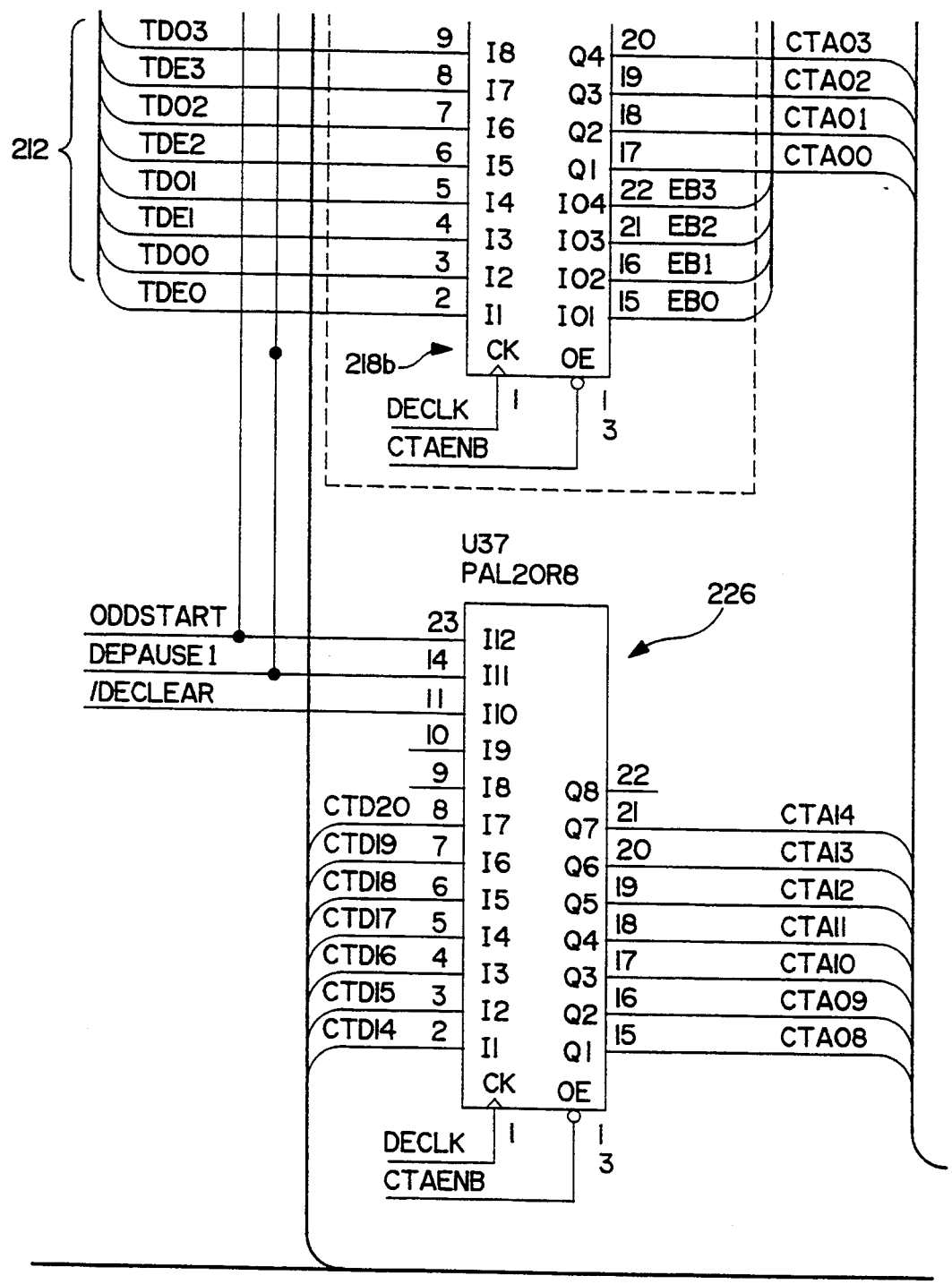
Figure 3G:
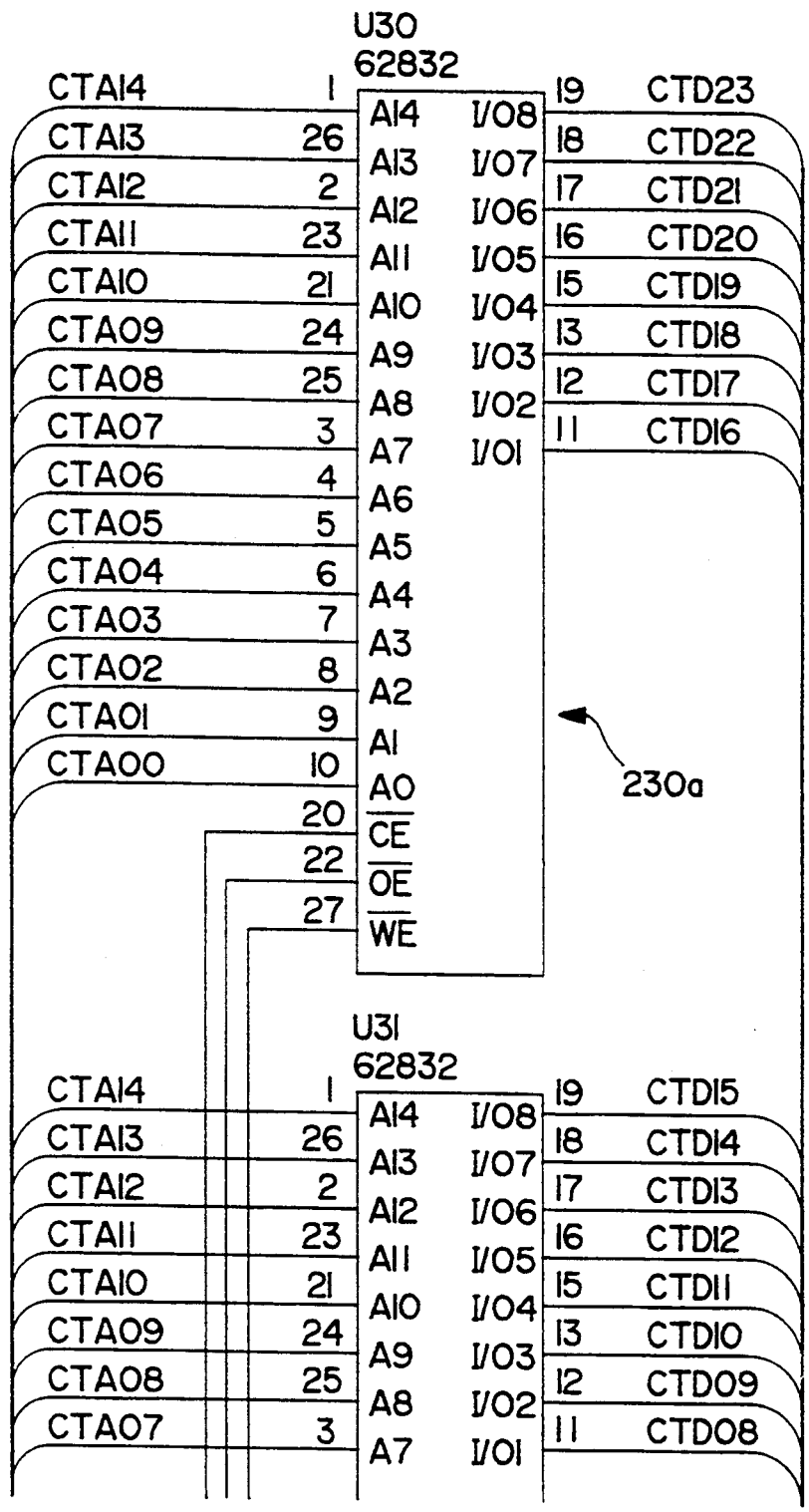
Figure 3H:
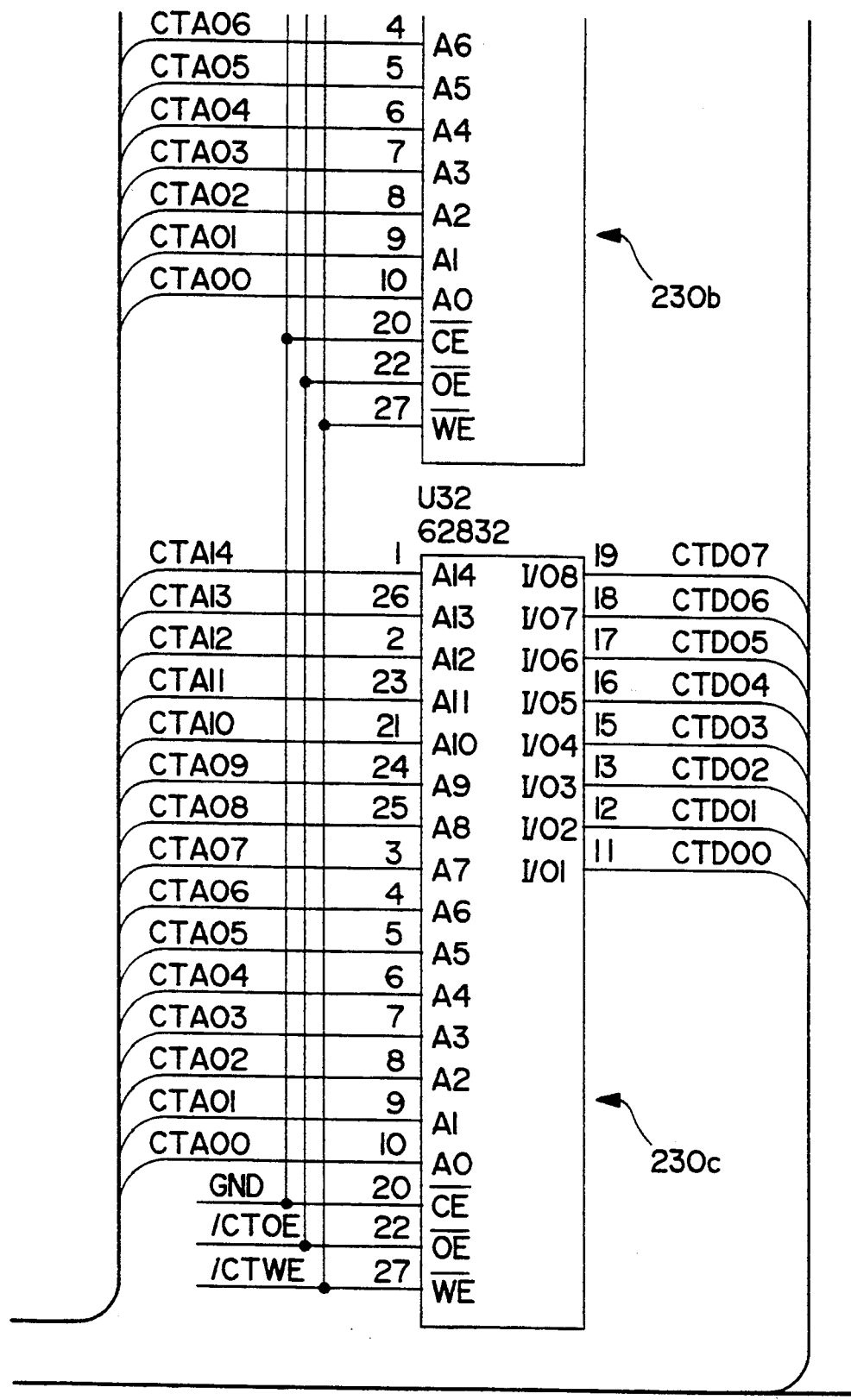
Figure 3I:
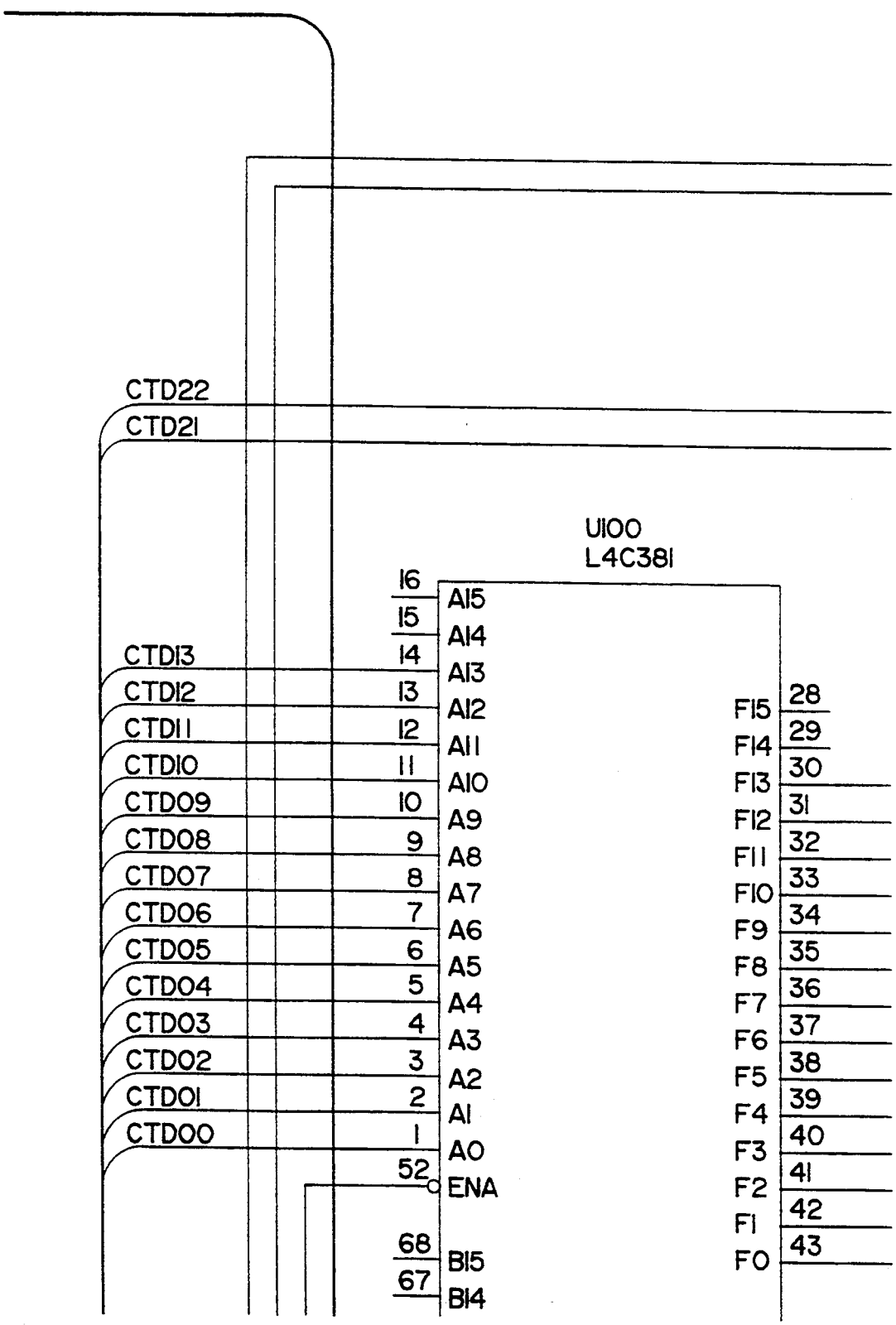
Figure 3J:
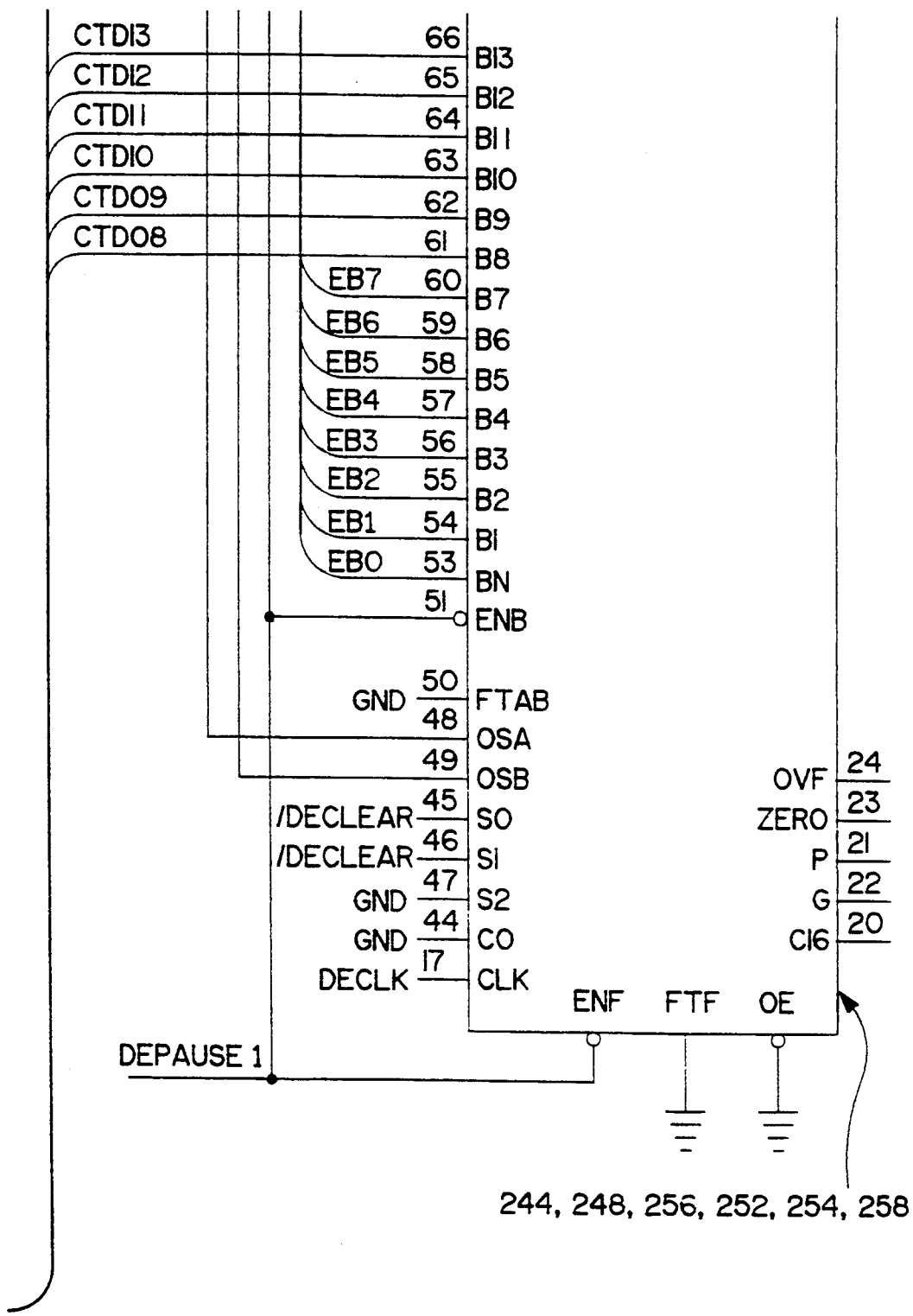
Figure 3K:
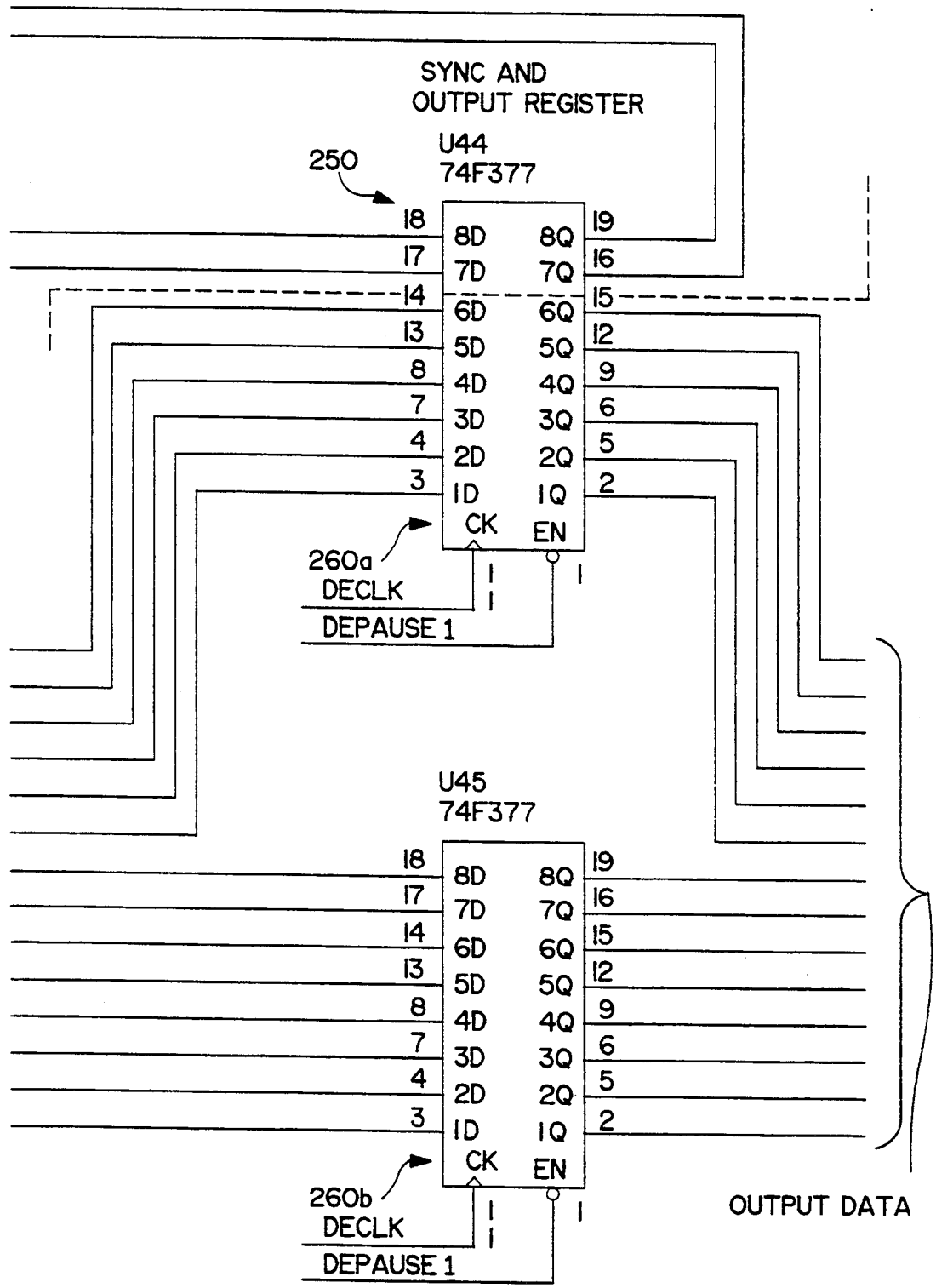

As best seen in FIGS. 3e and 3f, multiplexers 218 and 222 (discussed in detail later), and token register 220 may be implemented using suitable Programmable Array Logic (PAL) devices 218a and 218b. PAL 218a provides all of the functions of multiplexers 218, 222 and token register 220 for the low-order four bits of the token and extended bytes, and PAL device 218b provides these functions for the high-order four bits thereof. PAL devices 218a and 218b may be a suitable registered PAL device, such as type PAL20R4, which is commercially available from Advanced Micro Devices, Sunnyvale, Calif., and from other suppliers. A set of suitable PAL equations for specifying the operation of devices 218a and 218b are shown in Tables 4 and 5 respectively.

The code table memory 320 has 15 address bits and 24 data bits. Seven of the output data bits produced by the code table memory 320 during each decoding cycle are defined as a "prefix word". The prefix word is produced in order to carry forward any information bits which were provided in the current token, but which were not needed to decode the current code word, for use in the next decoding cycle. The prefix word produced during each cycle is supplied on lead 232 to the input of prefix register 226, which retains the prefix word for use in the following decoding cycle. The output of the prefix register 226 is connected to the seven most significant address bits of the code table memory 230 via lead 228. Accordingly, during each decoding cycle, the code table memory 230 receives the prefix word generated during the previous decoding cycle. However, the prefix register 226 is automatically initialized to zero at the beginning of operation of the decoder 100. Prefix register 226 may be a suitable registered PAL device, such as type PAL20R8, which is commercially available from Advanced Micro Devices, Sunnyvale, Calif. and from other suppliers. A set of suitable PAL equations for specifying the operation of device 226 are shown in Table 6.

The contents of the token register 220 are managed by the control logic 216 and token source selection multiplexer 218 such that a token containing data to be decoded is available therein at the beginning of each cycle. The output of the token register 220 is connected to the eight least significant address bits of the code table memory 230 via lead 224. Accordingly, during each decoding cycle, the code table memory 230 receives, at its address inputs, both the 7-bit prefix word generated during the previous decoding cycle, and an 8-bit token containing data to be decoded. Since the code table memory 230 has 15 address bits, the prefix word and the currently decodable token cooperate to supply a complete address to the code table memory at the beginning of each decoding cycle. Responsive to this address, the code table memory 230 supplies a 24-bit output word which includes a 7-bit prefix word on bus 232 for use in the next decoding cycle, a 14-bit decoded source symbol on bus 234, and a three-bit control word represented by individual leads 236, 238 and 240.

The control word determines how the decoded source symbol will be interpreted to produce an output word, and determines the number of additional bytes to be read from the input data stream for use in the next decoding cycle. In particular, the control word indicates whether the source symbol is relative (i.e. dependent on the value of the previous pixel) or absolute (i.e. independent of the value of the previous pixel), and whether an absolute source symbol is "extended" or "short" in the sense defined above. In addition, the control word indicates whether the next decoding cycle is to be decoded in "multi-pixel" mode—that is, whether the current token will be retained for further decoding, or a new token will be obtained from the input stream. The control word is supplied to the control logic 216 of the input bus interface and synchronization section 262 by leads 236 and 238, and to a synchronization register of the arithmetic postprocessing and output section 246 via leads 238 and 240.

Although the control word is symbolically represented in FIGS. 2A-2B to as three individual signals on leads 236, 238 and 240 corresponding to the three characteristics determined by the control word, in the physical reality of the physical implementation shown in FIGS. 3A-3K the control word is actually encoded for compatibility with components of the arithmetic postprocessing and output section 246. Table 7 below indicates how the encoded control word is interpreted.

The arithmetic postprocessing and output section 246 interprets each source symbol decoded by the code translator section 264 according to the mode information in the control word, thereby producing an output pixel. If the mode of the source symbol is "short relative", the output section 246 adds the value of the source symbol to the value of the previous pixel and presents the resulting quantity for output. If the mode of the source symbol is "short absolute", the output section 246 presents the source symbol for output, without further processing. If the mode of the source symbol is "extended absolute", the output section 246 concatenates the upper six bits of the source symbol to an extension byte retrieved from the input data stream, and presents that result for output.

The arithmetic postprocessing and output section 246 comprises a prior pixel register 256, a short code pixel data register 248, an extended code pixel data register 244, a synchronization register 250, multiplexers 252 and 258, an adder 254, an output register 260, and an output bus 108.

Prior pixel register 256 is preferably a 14-bit register which receives and stores the value of the most recently output pixel from the adder 254. This value is required in order to calculate an output pixel value when relative mode source symbols are processed.

Short code pixel data register 248 is preferably a 14-bit register which receives the 14-bit decoded source symbol output from code table memory 230 via lead 234. This value is needed whenever "short" mode source symbols are processed.

Extended code pixel data register 244 is preferably a 14-bit register. Register 244 receives the six high-order bits of the decoded source symbol on its six most significant input bits. Whenever the currently decoded source symbol is an extended mode symbol, the six high-order bits of the symbol contain a base value which is an exact multiple of the quantity 256. In addition, register 244 also receives at its eight least significant data inputs the byte following the currently decoded token in the input stream. This byte is obtained from multiplexer 222. Whenever the currently decoded source symbol is an extended mode symbol, the byte following the current token in the input string is an extension byte which must be concatenated with the base value to reconstruct the source symbol. Note that register 244 always concatenates the high-order six bits of the decoded source symbol with the input byte following the current token, but if the source symbol is not an extended symbol, the resulting value is meaningless and is therefore ignored.

The adder 254 is used to calculate the output pixel value for all possible source symbol modes. The output of multiplexer 258 is connected to a first input of adder 254. Multiplexer 258 selects whether to supply a value of zero or the prior pixel value from register 256 to the first adder input, depending on whether the current source symbol mode is absolute or relative. The output of multiplexer 252 is connected to a second input of adder 254. Multiplexer 252 decides whether to apply the output of the short code pixel data register 248 or the extended code pixel data register 244 to the second adder input, depending on whether the current absolute source symbol mode is "short" or "extended".

The adder 254 calculates a final pixel output as the sum of the two input values and provides it to output register 260. Output register 260 then provides the final pixel value output on output bus 108. Synchronization register 250 delays signals 238 and 240 by one pipeline stage, to enable multiplexers 252 and 258 only when valid data is available.

Thus, when the current source symbol mode is "short relative", multiplexer 258 supplies the value of the previous pixel to the first adder input, and multiplexer 252 supplies the full 14-bit decoded source symbol to the second adder input. The output pixel value is then calculated as the sum of the previous pixel value and the relative value from the current token. When the current source symbol mode is "extended absolute", multiplexer 258 supplies the value zero to the first adder input, and multiplexer 252 supplies the concatenated absolute pixel value from register 244 to the second adder input. Since one input of the adder is zero, the output pixel value is the unaugmented contents of register 244.

As best seen in FIG. 3B, adder 254 may be implemented as a suitable arithmetic processing circuit having an operand width of at least 14 bits. For example, adder 254 may be a type L4C381 16-bit arithmetic unit, which is commercially available from Logic Devices, Inc. Sunnyvale, Calif. Preferably, the integrated circuit used to realize the adder 254 also incorporates the functions of multiplexers 252 and 258, and of registers 244, 248, 256. Output register 260 is preferably a 14-bit register and may be implemented using two 74F377 octal latches 260a and 260b. Sync register 250 is preferably a 2-bit register, and may be implemented using the two remaining gates 250a of the 74F377 latches which were not needed for register 250. The 74F377 octal latches are commercially available from Logic Devices, Inc., Sunnyvale, Calif., and National Semiconductor Corp., Santa Clara, Calif.

As noted previously, operation of the translation means 264 (FIGS. 2A-2B) is controlled by the contents of code tables 102 stored in code table memory 230 (FIG. 2B). The previously decoded prefix word (7 bits) and the current token byte (8 bits) are used to form a 15-bit address into the code table memory 230. In each decoding cycle, the code table memory produces a 24-bit output word including the decoded current source symbol, the prefix word to be fed back for use in decoding the next code word, and the control word used to interpret the current source symbol. Accordingly, another aspect of the present invention is the structure and operation of the code tables.

Figure 4:
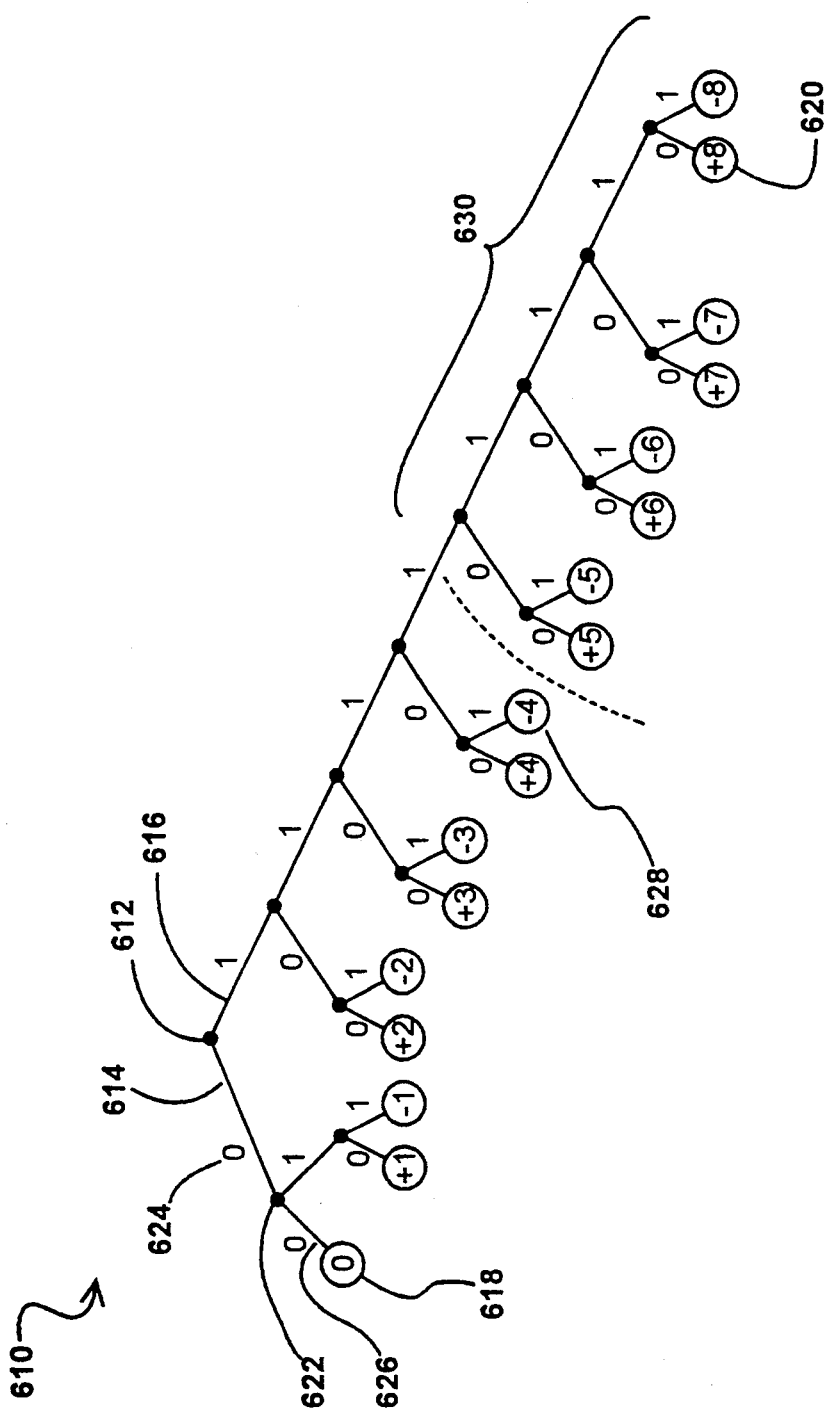
FIG. 4 is a tree diagram showing a prior-art Huffman-type scheme for encoding data using variable length tokens.

FIG. 4 depicts a binary tree diagram 610 representing a prior-art scheme for Huffman-encoding of integer values from −8 to +8 using code words of 2 to 8 bits. The tree diagram 610 and the associated code is discussed here to familiarize the reader with the use of tree diagram representations in general, and also to provide a base against which comparisons to the coding schemes of the present invention may be drawn. Table 8 shows the equivalent information in a tabular form. Either the tree 610 or Table 8 may be used for encoding or decoding purposes. Each node 612, 618, 620, 622 of the tree 610 (shown as dots or circles) and the branch immediately preceding that node correspond to a bit in a code word. The most significant bits (i.e. the leftmost bits) of the code word are those nearest the root node 612. The numerical values (such as the "0" identified by reference numeral 624) adjacent each branch (e.g. branch 614) indicates the binary value of the bit associated with that branch and with the node below it (e.g. node 622). Each of the terminal nodes or "leaves" (shown as circles 618, 620, 628) represents the source symbol identified therein (e.g. "+8" for leaf 620.

A selected source symbol may be encoded using tree 610 by finding its corresponding leaf, tracing a path from the root node 612 to that leaf, and successively concatenating onto the right-hand side of the code word string all the bit values corresponding to each node/branch which are successively encountered on that path. Accordingly, to encode the source symbol "0", one traces a path from the root node 612 to the corresponding leaf 618. Along such a path, one encounters node 622 (corresponding to binary value "0" found next to branch 614) and leaf (or terminal node) 618 (corresponding to binary value "0" found next to branch 626), and therefore the code word corresponding to a source symbol of "0" is "00". Similarly, to encode the source symbol "+8", one traces a path from the root node 612 to the corresponding leaf 620, and encounters the successive binary values "11111110".

A code word may be decoded by starting at the root 612 of the tree, and then following a path which is determined by choosing, at each node along the path, the branch of the tree having a binary value corresponding to the next bit in a series of bits determined by beginning with the most significant bit of the code word to be decoded, and then taking each succeeding less significant bit of that code word in turn. The code word has been completely decoded when a terminal node, or leaf, is reached; and then the source symbol corresponding to that code word is obtained from the leaf. Accordingly, to decode the code word "00", one starts at root 612, follows branch 614 (binary value 0) to node 622, and then follows branch 626 (binary value 0) to arrive at leaf 618 (source symbol "0"). Thus, according to this tree, code word "00" corresponds to source symbol "0".

Table 8 is essentially equivalent to the tree 610. It is evident from the tree that only two bits are required for the code word "00" which encodes source symbol "0". This is reflected in Table 8 by the code word entry "00XXXXXX" for source symbol "0". Bit positions containing an "X" are those for which the value is irrelevant. Since the maximum depth of tree 610 is eight levels, no more than eight bits are required to represent the code words in that tree.

Accordingly, a memory device having eight address bits (i.e. $2^8$ locations) could be used to decode individual code words according to the scheme of FIG. 4 by storing the source symbols as shown in Table 8 at addresses equal to each possible binary value of the corresponding code words. Then, by applying any code word to the address inputs of the memory device, the corresponding source symbol, which has previously been stored in the memory, will appear on the output. For code words shorter than the maximum length, one or more of the least significant bits of the address will be unspecified or "don't care" bits (shown by "X" in Table 8 ). Since these "don't care" bits may have any value, the source symbols for such code words must be replicated at each address matching the significant bits of the code word (i.e. for all possible combinations of the unspecified bits). It is noted that in prior art decoders implemented using conventional memory devices, each table entry would also contain a field giving the codeword length, which indicates how many bits the input must be shifted before decoding the next word.

It will be apparent from the foregoing discussion that a code table of $2^N$ entries is sufficient for coding and decoding schemes using code words of N or fewer bits, and that such a table is equivalent to a binary tree diagram having N levels below the root. A decoder for such a scheme may be implemented by a memory device having at least N address bits. Conversely, a tree diagram, such as that of FIG. 4, may be used to describe the contents of an equivalent code table without individually enumerating each entry in the table. Similar diagrams are used in other figures to graphically represent the more extensive code tables of the present invention.

An example of a code table and the operation of the invention therewith will now be described. For simplicity, only short relative and extended absolute codes are used. In this example, the coding method employs binary prefix codes developed using Huffman techniques.

The preceding discussion has employed the prior-art Huffman encoding scheme of FIG. 4 merely as a convenient example. A preferred embodiment of the present invention deviates from that scheme in several ways. First, the regular structure of the coding tree of FIG. 4, and the simple ordering of the source symbols were selected arbitrarily to serve as a convenient example for explanation. However, substantially improved compression efficiency is obtained by selecting a tree structure, and a source symbol ordering therein, that more accurately reflect the relative frequency with which the various source symbols are encountered in the image. Thus, when encoding images, an optimal coding scheme is preferably derived through analysis of one or more actual images, using statistical techniques which are attributed to Huffman and are now well known in the art. When thereafter decoding images, code table data corresponding to the scheme by which the image was encoded must be loaded into the code table memory 230. Since the arbitrary ordering of FIG. 4 is a convenient example, however, and since it is not inherently incorrect (the tree structure and source symbol ordering may actually be optimal for some images), that ordering is retained throughout the descriptions herein.

A second deviation from the coding scheme of FIG. 4 relates to the representation of source symbols which are substantially displaced from those most frequently encountered. In pure Huffman-type coding schemes, the shortest available code words are assigned to the most frequently occurring source symbols, and progressively longer code words are assigned to progressively less frequently occurring symbols. For source symbols which occur rarely, the code word may be very long. This makes it difficult and expensive to implement a decoder using a simple memory device, because the size of the memory must be doubled for each bit by which the maximum code word size is increased. Of course, the code word size, and thus the size of the memory device needed for decoding, could be arbitrarily limited, thereby effectively truncating the code tree, but this would make it impossible to encode and decode some source symbols within the intended valid range thereof, and would adversely affect the quality of the reconstituted image, which is an unacceptable trade-off for diagnostic medical imaging and perhaps some other applications as well.

Figure 6:
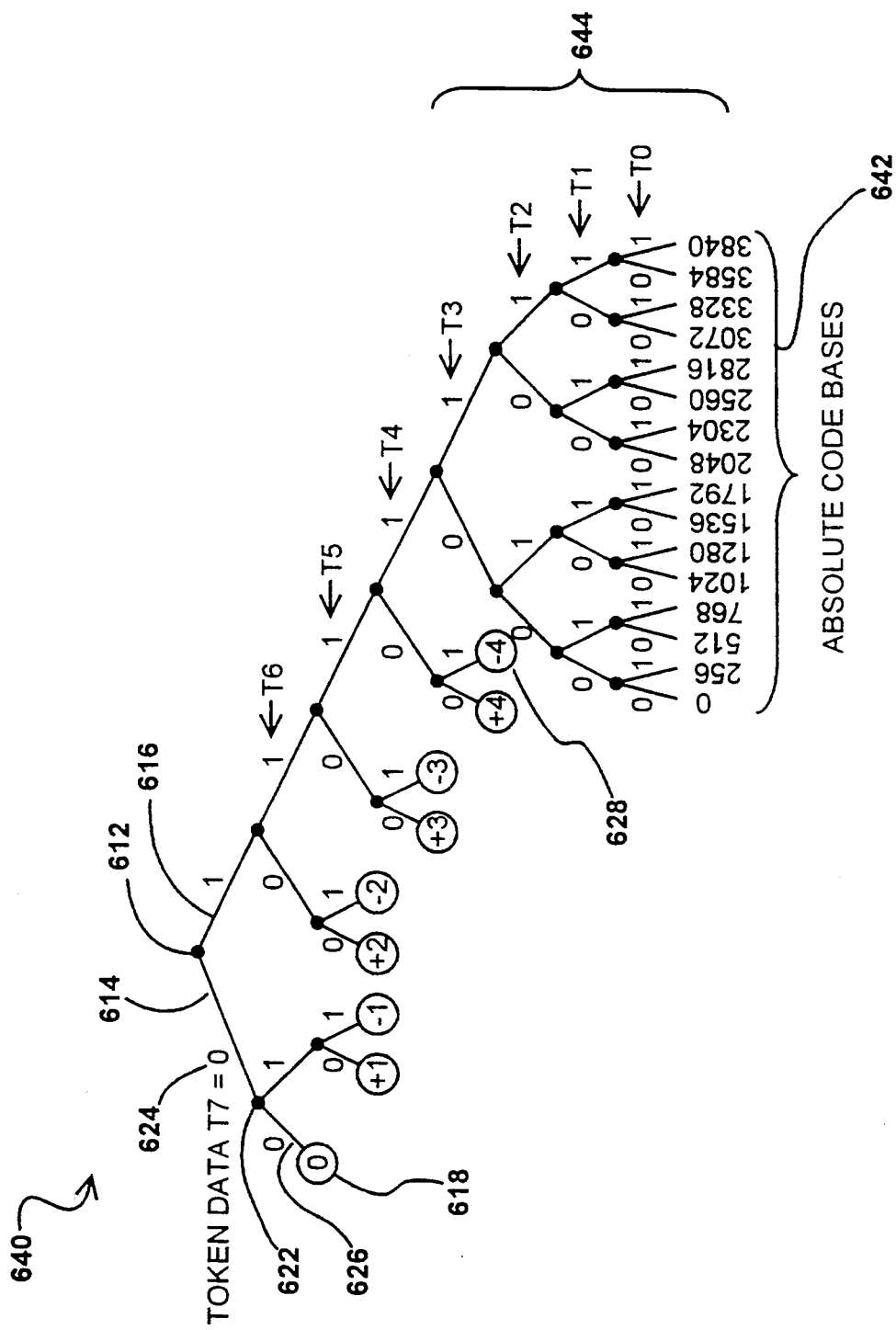
FIG. 6 is a tree diagram showing, in greater detail, one of the subtrees of FIG. 5.

In order to ensure that every valid source symbol may be encoded and decoded by each table, the Huffman coding scheme is modified, and the last 16 codes in each code table are reserved for representing absolute codes. FIG. 6 shows a modified truncated-Huffman code tree 640 of the type used with the present invention. The tree is referred to as an "eight-bit" tree because it is suitable for encoding or decoding code words of up to eight bits in length. An equivalent code table is referred to as an "8-bit" table and is shown in its fully enumerated form as Table 9. The same code table is shown in abbreviated form in Table 10 (i.e. showing all instances of "short" code words grouped together using "don't care" bits, rather than enumerating each possible code word).

The code tree 640 of FIG. 6 is similar to the code tree 610 of FIG. 4, but the bottom four levels (or bits) 630 of the standard Huffman tree structure is truncated, and is replaced with a balanced binary subtree 644 representing the 16 base values 642 for absolute codes. Since the preferred embodiment of the invention disclosed herein is designed to represent source symbol values ranging from 0 through 4095, a total of 12 bits are needed to store an absolute source symbol. The absolute code bases provide only the most significant four bits of the absolute source symbols. The missing least significant eight bits are provided by an extension byte which is read from the input data stream.

In the present invention, each table entry contains not only a symbol field, but also the prefix for the next decoding step. Table 9 is a fully enumerated 8-bit table which includes the prefix entries. In the example of the symbol zero, the 64 entries bearing identical symbols would each have a different value in the prefix field. Thus, the six bits of data following the two codeword bits are encoded in the prefix for the following decoding cycle. The number of times a symbol is replicated, and thus, the contents of the prefix field, depends on the maximum number of code word bits the table encodes. This information is summarized in Table 11 for tables of 8-bit through 14-bit maximum codeword length.

Figure 5:
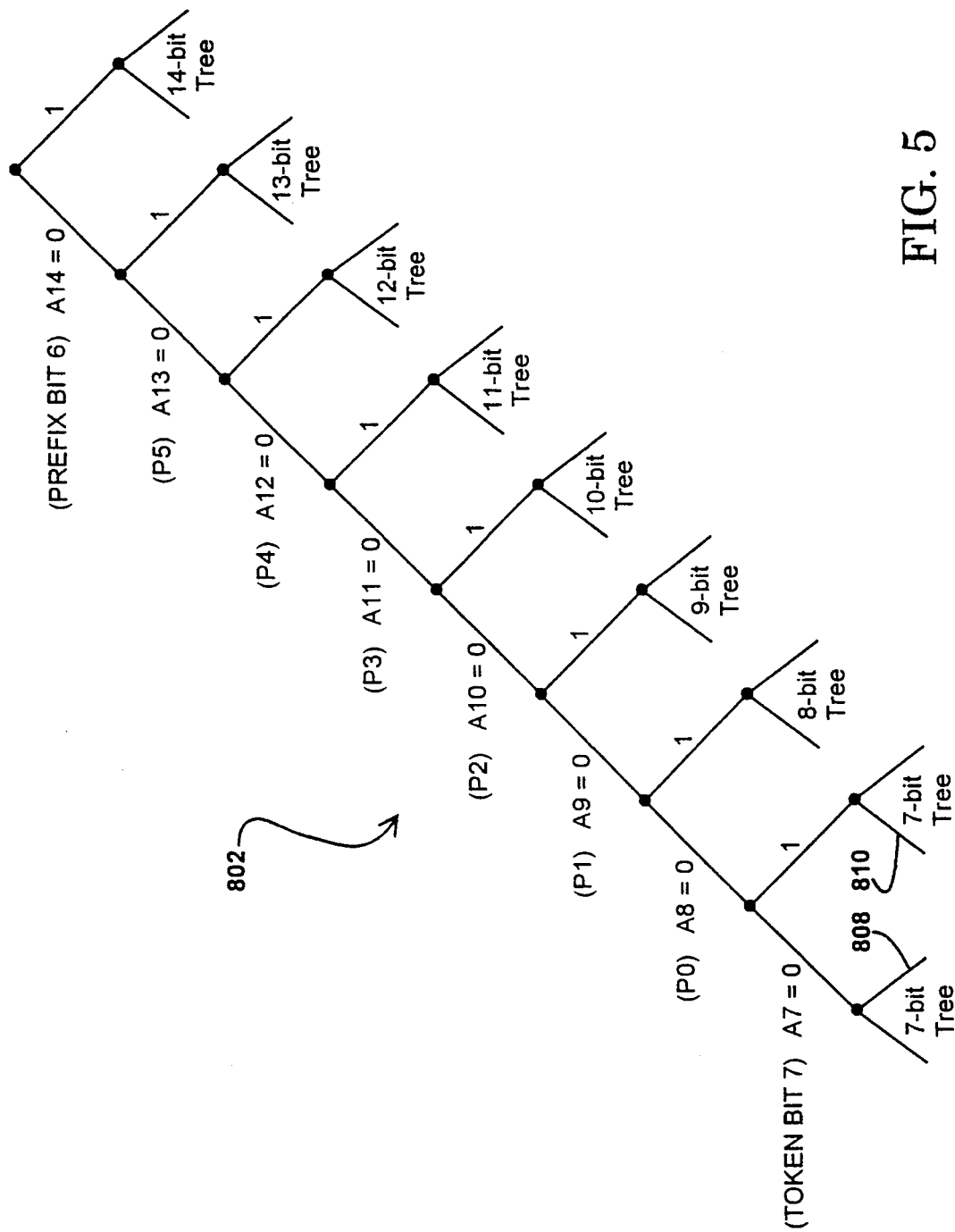
FIG. 5 is a tree diagram showing, in overview, a scheme for organizing a code table for use with the inventive decoder of FIGS. 1–3.
Figure 7:
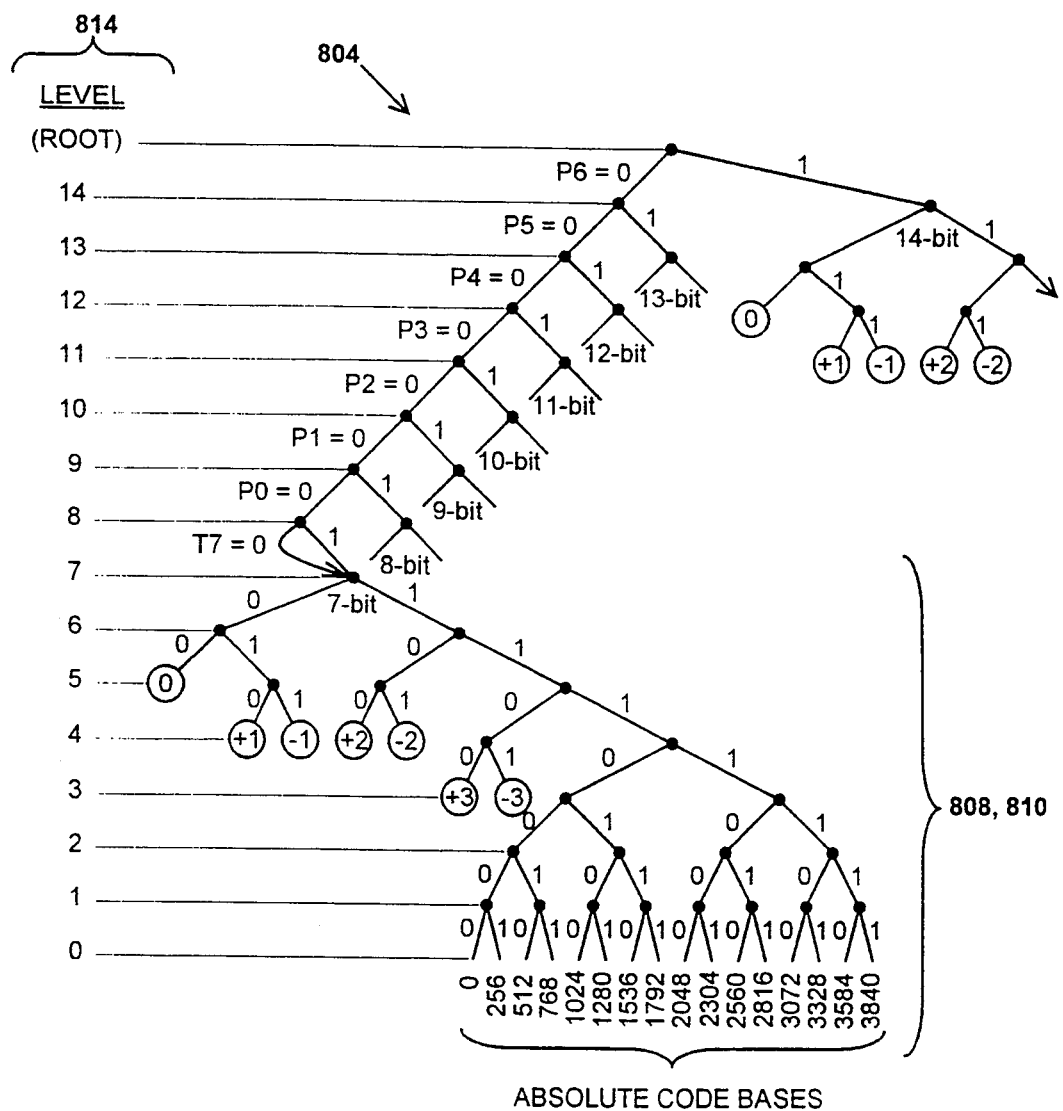
FIG. 7 is a tree diagram showing the tree diagram of FIG. 5 in greater detail.
Figure 8:
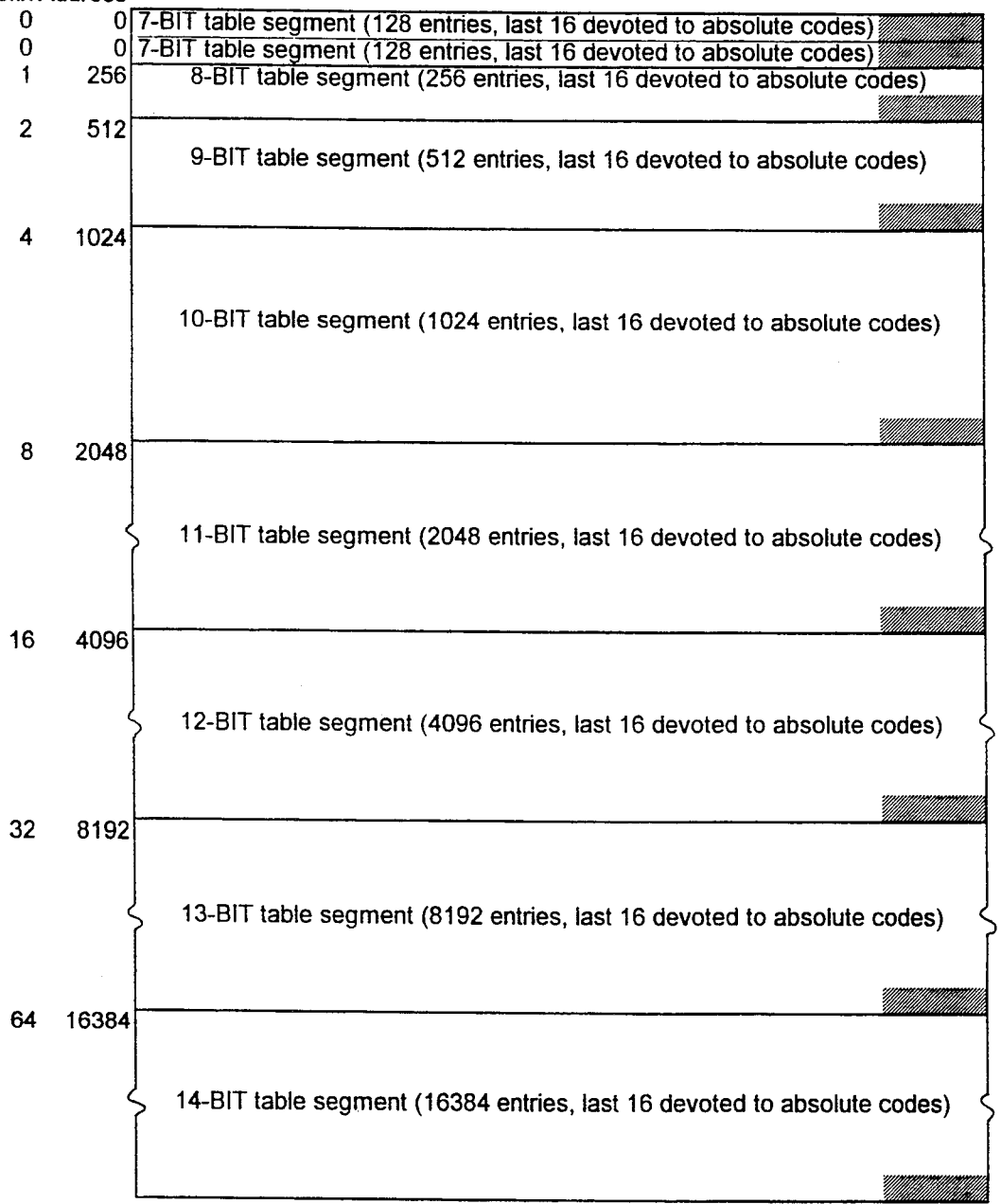
FIG. 8 is a diagram showing the organization of a code table for the decoder of FIGS. 1–3 resulting from the use of the scheme of FIGS. 5–7.

The prefix carries information about both the number of bits encoded and the value of those bits. FIGS. 5, 7, and 9, and Tables 12 and 13 show a possible convention. It is possible to encode the length and data value for zero through 6 bits, using 127 of the 128 codes of a seven-bit prefix. The remaining prefix code, zero, is used to select a special "7-bit" table which will be described later. In this embodiment of the invention, the 15 address bits of the code table consist of the prefix in the high 7 bits and the token in the low 8 bits. Thus, for example, when the prefix is in the range of 64–127, the upper bit of the prefix signifies that six data bits are fed forward, and the low six bits of the prefix represent the data.

Therefore, the upper half of the code table is a table for parallel decoding of 14 bits of information from the incoming data stream. The remainder of the code table space is segmented into tables for decoding 13, 12, 11, 10, 9, 8 and 7 bits of input data. The structure of the code table is illustrated by the tree diagrams 802 and 804 in FIGS. 5 and 7, and the code table address layout diagrams 806 in FIG. 9. This information is also shown tabularly. Table 13 summarizes the prefix codes by range and identifies the size of the data and the particular table each prefix range encodes. Table 12 enumerates each individual prefix code, and the data size and value it encodes.

As best seen in FIG. 7, the two seven bit trees 808, 810 are identical, and thus the seven-bit case ignores token bit 7. (This assignment of the prefix codes along binary boundaries is convenient for illustrating the coding method, but the actual assignment of prefix codes could be in any order, provided that the code tables were changed accordingly.)

The decoder 100 of the present invention decodes and outputs a pixel for every clock cycle. Since the amount of input data available in any one cycle varies between 7 and 14 bits depending on the value of the prefix, provision must always be made for encoding all possible values in the source alphabet. Extended absolute codes provide this capability. For simplicity, only short relative and extended absolute codes are used. The lower eight bits of an extended absolute code come from an extension word fetched from the data stream in the byte following an extended absolute code word, but the upper bits of the extended absolute code must come from the code table. This means that each subtable must have codes reserved for every possible value of the upper six bits of the pixel value. Most medical images require 12 bits or less, and therefore sixteen locations must be reserved in each subtable. The cost of this requirement is one-sixteenth of the code space in the eight-bit subtable, and proportionately less in the larger tables. FIG. 6 shows the eight-bit decoding tree 640, modified to provide the needed absolute codes. The computer program or hardware encoder which creates the compressed data file must ensure that the extended absolute codes are used where required.

The rules for structuring the code table will now be described. As shown in FIG. 7, a level is defined as the number of nodes above the bottom of the table (see the level indicators 814). If a leaf is at level n, there are n levels below it, and thus $2^n$ locations occupied in the table. These $2^n$ locations, since they are selected by bits to the right of the end of the codeword decoded at the leaf, may be encoded in the prefix to be used in the next decoding cycle.

The table uses a "lazy" algorithm—i.e., if there are six or fewer bits left after decoding the present code, the bits will always be passed on in the prefix and used in conjunction with the next token from the byte stream, even if the leftover bits themselves contain sufficient information to decode another codeword. If n bits are left and n< =6, then the prefix will point to an entry in the (n+8)-bit decoding table. If there are more than 6 bits remaining, the MULTI PIXEL mode bit will be set in the code table output, and the next pixel will be decoded using the same token as in the present cycle. In this case, the prefix will point to an entry in the n-bit decoding table. Therefore, every leaf at level 6 or higher has the MULTI PIXEL bit set in its code table entries. The code table assignments are outlined in Table 14.

Level 7 is a special case. When a leaf is at level 7, the high bit in the token was the last bit in the codeword. Since there are more than 6 bits left over, the MULTI PIXEL bit is set and the token is decoded, this time using only the low 7 bits. The seven bit table provides this capability. Since the high bit of the token could be either 0 or 1, the 7-bit table is replicated in the upper and lower halves of the prefix zero table region.

FIG. 10 shows a sample data stream 900 which has been encoded according to the encoding scheme of the present invention. In FIG. 10, an encoded stream of bits containing several code words is shown in row 930. Row 902 numerically identifies the code words, each corresponding to a cycle of the inventive decoder hardware in which a decoded pixel is produced. Each of columns 910, 912, 914, 916, 918, 910, and 912 correspond to an individual code word. Row 904 shows the value of each pixel from which the code word is generated. Row 906 shows the source symbol used to describe the pixel's value. Row 908 indicates whether the source symbol is relative or absolute. Using a "relative" source symbol whenever possible spatially decorrelates the image data, thereby allowing shorter codes to be used so that compression is achieved.

FIG. 11 is a table depicting the decoding of the data stream of FIG. 10. Column 902a numerically identifies the decoding steps or cycles, each corresponding to a code word or pixel of FIG. 10. Rows 910a, 912a, 914a, 916a, 918a, 910a, and 912a correspond to the decoding step required to decode the equivalent code word of FIG. 10. Column 930a shows the token from the input data stream which was used in each step. For cycles in which the source symbol was an extended absolute symbol, column 930b shows the extension word fetched from the input data stream. Column 940 shows the prefix word which was used in each step. Together, the prefix word and the token form the value used to address the code table memory 230 (FIG. 2B) of the decoder 100. Column 934 shows the source symbol portion of the output of the code table memory 230 in each step (i.e. the contents of register 248). If the source symbol is an extended absolute symbol, column 936 shows the value produced when the absolute code base produced by the code table memory 230 is concatenated with the extension word obtained from the data stream. Column 938 shows the prefix word generated during the current decoding step for use in the following decoding cycle. Column 908a shows the control information used to interpret the source symbol in order to produce a final pixel value. Column 904a shows the pixel output as a result of each decoding step.

Although the inventive decoder 100 is described herein as it is applied to the environment of an image data display system, that environment is merely an example of one in which the invention may be used. As disclosed herein, the inventive decoder apparatus and methods are particularly advantageous for rapidly decoding data meeting the following criteria:

(1) fixed length source symbols are encoded as variable length bit strings;
(2) some source symbols occur much more frequently than others; and
(3) shorter bit strings are assigned to encode the more frequently occurring source symbols.

Digital images acquired from natural sources are among those known to be efficiently encoded using schemes meeting these criteria. However, it is noted that sampled data representing a wide variety of other real-world signals also may be efficiently encoded in such formats, and therefore, the inventive decoder apparatus and method are equally applicable in such applications. For example, the invention may advantageously used to reproduce high-frequency signals acquired from scientific instrumentation.

Further, the disclosed apparatus and method may be applicable to a more general class of decoding problems, with modifications to the organization of the code tables 102 or to the hardware of the decoder, without departing from the spirit of the invention. For example, it is possible to employ other coding methods which do not rely on packaging binary prefix codes in the fixed length tokens. For example, an arithmetic coding scheme, which avoids the requirement that codewords be delineated by bit boundaries, may be employed and thereby offer somewhat better compression ratios than the binary prefix coding method described herein.

The above-described embodiment of the invention is merely one example of a way in which the invention may be carried out. Other ways may also be possible, and are within the scope of the following claims defining the invention.

TABLE 1

| | |
|---|---|
| TITLE | LAI DX |
| PATTERN | DXU48 |
| REVISION | A |
| AUTHOR | KEVIN ALLMARAS |
| COMPANY | Laboratory Automation Inc. |

;

TABLE 1-continued

```
;
CHIP    DXU48   PAL20R8
;1      2       3         4       5       6       7       8    9       10        11       12
CLK     PIXFF0  DECLEAR   TDEF3   TDEF2   TDEF1   TDEF0   NC   FIFOFB  PIXVALID  CTAENB   GND
;
;13     14                16      17      18                        21         23       24
/OE     TILELOAD          EFIFO   GODE    RENDFUL                   DECLK      DEPAUSE  VCC
;
;
EQUATIONS
;
DECLK    := /DECLK        ; DIVIDE BY 2 CLOCK
/RENDFUL := /PIXFF0 * DECLK ;ONLY CHANGE ON DECLK HIGH
          + /RENDFUL * /DECLK ;HOLD ALWAYS
/EFIFO   := /TDEF0 * DECLK ;CHANGE ON DECLK HIGH
          + /TDEF1 * DECLK ;CHANGE ON DECLK HIGH
          + /TDEF2 * DECLK ;CHANGE ON DECLK HIGH
          + /TDEF3 * DECLK ;CHANGE ON DECLK HIGH
          + /EFIFO * /DECLK ;HOLD ALWAYS
/GODE    := DECLK * TILELOAD * EFIFO
          + DECLK * FIFOFB * EFIFO
          + /GODE * TILELOAD
          + /GODE * FIFOFB
          + /GODE * /DECLK ;HOLD ALWAYS
```

TABLE 2

```
TITLE       LAI DX
PATTERN     DXU49
REVISION    B
AUTHOR      KEVIN ALLMARAS
COMPANY     Laboratory Automation Inc.
;
;
CHIP    DXU49   PAL20R6
;1     2        3       4          5        6        7        8     9       10       11       12
CLK    RLUTA14  2XZOOM  RCLEARDE   CTIOENB  DECLEAR  CTOUTEN  GODE  FIFOFB  CTWE     CTAENB   GND
;
;13    14       15      16         17  18   19       20       21    22         23       24
/OE    GODEDLY  CTOE    PIXVALID   Q0  Q1   LUTA14   FIFOMR   NC    DEPAUSE1   DEPAUSE  VCC
;
;
EQUATIONS
;
CTOE      = /CTOUTEN         ;DISABLE OUTPUT WHEN WRITE
          + /DECLEAR * /GODE ;DISABLE OUTPUT AT START OF DECOMPRESSION ONLY
DEPAUSE1  = DEPAUSE * /CTAENB
          + /PIXVALID * 2XZOOM * /LUTA14
/LUTA14   := /2XZOOM * /RLUTA14 ;FORCE BY DIRECT WRITE
          + 2XZOOM * PIXVALID ;HOLD LOW UNTIL VALID PIXEL STARTS
          + 2XZOOM * /PIXVALID * LUTA14 * /DEPAUSE ;TOGGLE NO PAUSE
          + 2XZOOM * /PIXVALID * /LUTA14 * DEPAUSE ;HOLD LOW IF PAUSE
/PIXVALID := /GODEDLY * DECLEAR * Q1 * /DEPAUSE
          + /PIXVALID * /GODEDLY
Q0 := /Q0 * DECLEAR * /GODEDLY * /DEPAUSE
   + Q0 * Q1 * DECLEAR * /GODEDLY
   + Q0 * /GODEDLY * DEPAUSE
Q1 := /Q1 * Q0 * DECLEAR * /GODE * /DEPAUSE
   + Q1 * DECLEAR * /GODEDLY
/FIFOMR := GODE * /GODEDLY
        + RCLEARDE
```

TABLE 3

```
TITLE       LAI DX
PATTERN     DXU38
REVISION    A
AUTHOR      KEVIN ALLMARAS
COMPANY     Laboratory Automation Inc.
;
;
CHIP    DXU38   PAL20R8
;1      2       3       4         5    6        7         8     9    10    11      12
DECLK   BIGEND  CTD23   RCLEARDE  NC   RENDFUL  DEPAUSE1  GODE  NC   NC    EFIFO   GND
;
;13     14      15       16       17    18      19    20    21    22       23      24
/OE     NC      GODEDLY  DEPAUSE  TDR0  OSTART  TDR1  TDR2  TDR3  DECLEAR  CTD22   VCC
;
;
EQUATIONS
```

TABLE 3-continued

```
;
/GODEDLY  := /GODE                          ;ONE CLOCK DELAY OF GODE
/DECLEAR  := GODEDLY * /GODE                ;CLEAR THE PREFIX AND TO CLEAR THE PIXEL FIFOS
           + RCLEARDE
DEPAUSE   := /EFIFO * /GODE                 ;PAUSE ON MT FIFO
           + /RENDFUL * /GODE                ;PAUSE ON REAR END FULL
/OSTART   := /BIGEND * /DECLEAR              ;LOW ON CLEAR
           + /BIGEND * /GODE * GODEDLY       ;STARTUP CONDITION
           + /BIGEND * /OSTART * DEPAUSE1    ;HOLD WHEN PAUSE OF DE
           + /BIGEND * OSTART * CTD23 * /CTD22 * /GODEDLY * /DEPAUSE1   ;TOGGLE LOW WHEN SINGLE
           + /BIGEND * /OSTART * /CTD23 * /GODEDLY * /DEPAUSE1          ;HOLD MULTI PIXEL
           + /BIGEND * /OSTART * CTD23 * CTD22 * /GODEDLY * /DEPAUSE1   ;HOLD LOW IF EXTENDED
/TDR0     := /BIGEND * /GODE * GODEDLY       ;ENSURE THAT STARTS CORRECT
           + /BIGEND * /GODEDLY * CTD23 * CTD22 * /DEPAUSE1 * /TDR2 * TDR0 ;SEA & 1X0X
           + /BIGEND * /GODEDLY * CTD23 * /CTD22 * /DEPAUSE1 * /TDR3 * TDR0 ;SSA & 1XX0
           + /BIGEND * /GODEDLY * CTD23 * /CTD22 * /DEPAUSE1 * /TDR0 * TDR1 ;HOLD SSA & 01XX
           + /GODEDLY * /TDR0 * /CTD23 * /DEPAUSE1       ;HOLD MULTI PIXEL
           + /GODEDLY * /TDR0 * DEPAUSE1                 ;HOLD WHEN PAUSE
           + BIGEND * /GODEDLY * /DECLEAR                ;SPECIAL CASE STARTUP
           + BIGEND * /GODEDLY * CTD23 * CTD22 * /DEPAUSE1 * TDR0 * /TDR2 ;SEA BIGEND
/TDR1     := /BIGEND * /GODEDLY * CTD23 * CTD22 * /DEPAUSE1 * /TDR3 * TDR1 ;SEA & X1X0
           + /BIGEND * /GODEDLY * CTD23 * /CTD22 * /DEPAUSE1 * /TDR0 * TDR1 ;SSA * 01XX
           + /BIGEND * /GODEDLY * CTD23 * /CTD22 * /DEPAUSE1 * /TDR1 * TDR2 ;HOLD SSA * X01X
           + /BIGEND * /GODEDLY * /DECLEAR               ;SPECIAL CASE STARTUP
           + BIGEND * /GODE * GODEDLY                    ;SPECIAL CASE STARTUP
           + /GODEDLY * /TDR1 * /CTD23 * /DEPAUSE1       ;HOLD MULTI PIXEL
           + /GODEDLY * /TDR1 * DEPAUSE1                 ;HOLD WHEN PAUSE
           + BIGEND * /GODEDLY * CTD23 * CTD22 * /DEPAUSE1 * TDR1 * /TDR3 ;SEA BIGEND
/TDR2     := /BIGEND * /GODEDLY * CTD23 * CTD22 * /DEPAUSE1 * /TDR0 * TDR2 ;SEA & 0X1X
           + /BIGEND * /GODEDLY * CTD23 * /CTD22 * /DEPAUSE1 * /TDR1 * TDR2 ;SSA * X01X
           + /BIGEND * /GODEDLY * CTD23 * /CTD22 * /DEPAUSE1 * /TDR2 * TDR3 ;HOLD SSA & XX01
           + /BIGEND * /GODEDLY * /TDR2 * /CTD23 * /DEPAUSE1       ;HOLD MULTI PIXEL
           + /GODEDLY * /TDR2 * DEPAUSE1                 ;HOLD WHEN PAUSE
           + BIGEND * /GODEDLY * CTD23 * CTD22 * /DEPAUSE1 * /TDR0 * TDR2 ;SEA BIGEND
/TDR3     := /BIGEND * /GODEDLY * CTD23 * CTD22 * /DEPAUSE1 * /TDR1 * TDR3 ;SEA & X0X1
           + /BIGEND * /GODEDLY * CTD23 * /CTD22 * /DEPAUSE1 * /TDR2 * TDR3 ;SSA * XX01
           + /BIGEND * /GODEDLY * CTD23 * /CTD22 * /DEPAUSE1 * /TDR3 * TDR0 ;HOLD SSA * 1XX0
           + /GODEDLY * /TDR3 * /CTD23 * /DEPAUSE1       ;HOLD MULTI PIXEL
           + /GODEDLY * /TDR3 * DEPAUSE1                 ;HOLD WHEN PAUSE
           + BIGEND * /GODEDLY * CTD23 * CTD22 * /DEPAUSE1 * /TDR1 * TDR3 ;SEA BIGEND
```

TABLE 4

```
TITLE       LAI DX
PATTERN     DXU35
REVISION    A
AUTHOR      KEVIN ALLMARAS
COMPANY     Laboratory Automation Inc.
;
;
CHIP    DXU35    PAL20R4
; 1      2      3      4      5      6      7      8      9      10      11      12
CLK    TDE4   TDO4   TDE5   TDO5   TDE6   TDO6   TDE7   TDO7   CTD22   CTD23   GND
;
; 13     14       15     16     17      18      19      20     21     22       23       24
/OE    DEPAUSE  EB4    EB5    CTA04   CTA05   CTA06   CTA07   EB6    EB7     OSTART   VCC
;
;
EQUATIONS
;
/CTA07   := /TDE7 * /DEPAUSE * OSTART * CTD23 * /CTD22   ;ODD & SA
          +/TDE7 * /DEPAUSE * /OSTART * CTD23 * CTD22    ;EVEN * SE
          +/TDO7 * /DEPAUSE * /OSTART * CTD23 * /CTD22   ;EVEN * SA
          +/TDO7 * /DEPAUSE * OSTART * CTD23 * CTD22     ;ODD * SE
          + /CTA07 * /CTD23          ;HOLD ON MULTI PIXEL
          + /CTA07 * DEPAUSE         ;HOLD ON PAUSE
/CTA06   := /TDE6 * /DEPAUSE * OSTART * CTD23 * /CTD22   ;ODD & SA
          +/TDE6 * /DEPAUSE * /OSTART * CTD23 * CTD22    ;EVEN * SE
          +/TDO6 * /DEPAUSE * /OSTART * CTD23 * /CTD22   ;EVEN * SA
          +/TDO6 * /DEPAUSE * OSTART * CTD23 * CTD22     ;ODD * SE
          + /CTA06 * /CTD23          ;HOLD ON MULTI PIXEL
          + /CTA06 * DEPAUSE         ;HOLD ON PAUSE
/CTA05   := /TDE5 * /DEPAUSE * OSTART * CTD23 * /CTD22   ;ODD & SA
          +/TDE5 * /DEPAUSE * /OSTART * CTD23 * CTD22    ;EVEN * SE
          +/TDO5 * /DEPAUSE * /OSTART * CTD23 * /CTD22   ;EVEN * SA
          +/TDO5 * /DEPAUSE * OSTART * CTD23 * CTD22     ;ODD * SE
          + /CTA05 * /CTD23          ;HOLD ON MULTI PIXEL
          + /CTA05 * DEPAUSE         ;HOLD ON PAUSE
/CTA04   := /TDE4 * /DEPAUSE * OSTART * CTD23 * /CTD22   ;ODD & SA
          +/TDE4 * /DEPAUSE * /OSTART * CTD23 * CTD22    ;EVEN * SE
          +/TDO4 * /DEPAUSE * /OSTART * CTD23 * /CTD22   ;EVEN * SA
```

TABLE 4-continued

```
              +/TDO4 * /DEPAUSE * OSTART * CTD23 * CTD22   ;ODD * SE
              + /CTA04 * /CTD23           ;HOLD ON MULTI PIXEL
              + /CTA04 * DEPAUSE          ;HOLD ON PAUSE
EB7   = OSTART * TDE7
      + /OSTART * TDO7
EB6   = OSTART * TDE6
      + /OSTART * TDO6
EB5   = OSTART * TDE5
      + /OSTART * TDO5
EB4   = OSTART * TDE4
      + /OSTART * TDO4
```

TABLE 5

| TITLE    | LAI DX                    |
|----------|---------------------------|
| PATTERN  | DXU36                     |
| REVISION | A                         |
| AUTHOR   | KEVIN ALLMARAS            |
| COMPANY  | Laboratory Automation Inc.|

```
;
;
CHIP     DXU36   PAL20R4
;1       2       3       4       5       6       7       8       9       10      11       12
CLK      TDE0    TDO0    TDE1    TDO1    TDE2    TDO2    TDE3    TDO3    CTD23   DEPAUSE  GND
;
;13      14      15      16      17      18      19      20      21      22      23       24
/OE      CTD22   EB0     EB1     CTA00   CTA01   CTA02   CTA03   EB2     EB3     OSTART   VCC
;
;
EQUATIONS
;
/CTA03  := /TDE3 * /DEPAUSE * OSTART * CTD23 * /CTD22   ;ODD & SA
         +/TDE3 * /DEPAUSE * /OSTART * CTD23 * CTD22    ;EVEN * SE
         +/TDO3 * /DEPAUSE * /OSTART * CTD23 * /CTD22   ;EVEN * SA
         +/TDO3 * /DEPAUSE * OSTART * CTD23 * CTD22     ;ODD * SE
         + /CTA03 * /CTD23          ;HOLD ON MULTI PIXEL
         + /CTA03 * DEPAUSE         ;HOLD ON PAUSE
/CTA02  := /TDE2 * /DEPAUSE * OSTART * CTD23 * /CTD22   ;ODD & SA
         +/TDE2 * /DEPAUSE * /OSTART * CTD23 * CTD22    ;EVEN * SE
         +/TDO2 * /DEPAUSE * /OSTART * CTD23 * /CTD22   ;EVEN * SA
         +/TDO2 * /DEPAUSE * OSTART * CTD23 * CTD22     ;ODD * SE
         + /CTA02 * /CTD23          ;HOLD ON MULTI PIXEL
         + /CTA02 * DEPAUSE         ;HOLD ON PAUSE
/CTA01  := /TDE1 * /DEPAUSE * OSTART * CTD23 * /CTD22   ;ODD & SA
         +/TDE1 * /DEPAUSE * /OSTART * CTD23 * CTD22    ;EVEN * SE
         +/TDO1 * /DEPAUSE * /OSTART * CTD23 * /CTD22   ;EVEN * SA
         +/TDO1 * /DEPAUSE * OSTART * CTD23 * CTD22     ;ODD * SE
         + /CTA01 * /CTD23          ;HOLD ON MULTI PIXEL
         + /CTA01 * DEPAUSE         ;HOLD ON PAUSE
/CTA00  := /TDE0 * /DEPAUSE * OSTART * CTD23 * /CTD22   ;ODD & SA
         +/TDE0 * /DEPAUSE * /OSTART * CTD23 * CTD22    ;EVEN * SE
         +/TDO0 * /DEPAUSE * /OSTART * CTD23 * /CTD22   ;EVEN * SA
         +/TDO0 * /DEPAUSE * OSTART * CTD23 * CTD22     ;ODD * SE
         + /CTA00 * /CTD23          ;HOLD ON MULTI PIXEL
         + /CTA00 * DEPAUSE         ;HOLD ON PAUSE
EB3   = OSTART * TDE3
      + /OSTART * TDO3
EB2   = OSTART * TDE2
      + /OSTART * TDO2
EB1   = OSTART * TDE1
      + /OSTART * TDO1
EB0   = OSTART * TDE0
      + /OSTART * TDO0
```

TABLE 6

| TITLE    | LAI DX                    |
|----------|---------------------------|
| PATTERN  | DXU37                     |
| REVISION | A                         |
| AUTHOR   | KEVIN ALLMARAS            |
| COMPANY  | Laboratory Automation Inc.|

```
;
;
CHIP     DXU37   PAL20R8
;1       2       3       4       5       6       7       8       9       10      11        12
CLOCK    CTD14   CTD15   CTD16   CTD17   CTD18   CTD19   CTD20   NC      NC      DECLEAR   GND
;
;13      14        15      16      17      18      19      20      21      22      23       24
/OE      DEPAUSE   CTA08   CTA09   CTA10   CTA11   CTA12   CTA13   CTA14   NC      OSTART   VCC
;
```

TABLE 6-continued

```
;
EQUATIONS
;
CTA08 := CTD14 * DECLEAR * /DEPAUSE
      + CTA08 * DEPAUSE * DECLEAR    ;HOLD
CTA09 := CTD15 * DECLEAR * /DEPAUSE
      + CTA09 * DEPAUSE * DECLEAR    ;HOLD
CTA10 := CTD16 * DECLEAR * /DEPAUSE
      + CTA10 * DEPAUSE * DECLEAR    ;HOLD
CTA11 := CTD17 * DECLEAR * /DEPAUSE
      + CTA11 * DEPAUSE * DECLEAR    ;HOLD
CTA12 := CTD18 * DECLEAR * /DEPAUSE
      + CTA12 * DEPAUSE * DECLEAR    ;HOLD
CTA13 := CTD19 * DECLEAR * /DEPAUSE
      + CTA13 * DEPAUSE * DECLEAR    ;HOLD
CTA14 := CTD20 * DECLEAR * /DEPAUSE
      + CTA14 * DEPAUSE * DECLEAR    ;HOLD
```

TABLE 7

| Control Word Code | Recursion | Length | Base |
| --- | --- | --- | --- |
| 0 0 0 | Multi-Pixel | Short | Relative |
| 0 0 1 | Multi-Pixel | Short | Absolute |
| 0 1 0 | Multi-Pixel | Extended | Absolute |
| 0 1 1 | Illegal Code | ========= | |
| 1 0 0 | Single-Pixel | Short | Relative |
| 1 0 1 | Single-Pixel | Short | Absolute |
| 1 1 0 | Single-Pixel | Extended | Absolute |
| 1 1 1 | Illegal Code | ========= | |

TABLE 8

8-BIT TABLE, NORMAL HUFFMAN CODING

| | |
| --- | --- |
| 00XXXXXX | 0 |
| 010XXXXX | +1 |
| 011XXXXX | −1 |
| 100XXXXX | +2 |
| 101XXXXX | −2 |
| 1100XXXX | +3 |
| 1101XXXX | −3 |
| 11100XXX | +4 |
| 11101XXX | −4 |
| 111100XX | +5 |
| 111101XX | −5 |
| 1111100X | +6 |
| 1111101X | −6 |
| 11111100 | +7 |
| 11111101 | −7 |
| 11111110 | +8 |
| 11111111 | −8 |

TABLE 9

8-bit table (Prefix=1)

| Offset | Mode | Value | Prefix | Offset | Mode | Value | Prefix | Offset | Mode | Value | Prefix | Offset | Mode | Value | Prefix |
| --- | --- | --- | --- | --- | --- | --- | --- | --- | --- | --- | --- | --- | --- | --- | --- |
| 0 | SR | 0 | 64 | 64 | SR | 1 | 32 | 128 | SR | 2 | 32 | 192 | SR | 3 | 16 |
| 1 | SR | 0 | 65 | 65 | SR | 1 | 33 | 129 | SR | 2 | 33 | 193 | SR | 3 | 17 |
| 2 | SR | 0 | 66 | 66 | SR | 1 | 34 | 130 | SR | 2 | 34 | 194 | SR | 3 | 18 |
| 3 | SR | 0 | 67 | 67 | SR | 1 | 35 | 131 | SR | 2 | 35 | 195 | SR | 3 | 19 |
| 4 | SR | 0 | 68 | 68 | SR | 1 | 36 | 132 | SR | 2 | 36 | 196 | SR | 3 | 20 |
| 5 | SR | 0 | 69 | 69 | SR | 1 | 37 | 133 | SR | 2 | 37 | 197 | SR | 3 | 21 |
| 6 | SR | 0 | 70 | 70 | SR | 1 | 38 | 134 | SR | 2 | 38 | 198 | SR | 3 | 22 |
| 7 | SR | 0 | 71 | 71 | SR | 1 | 39 | 135 | SR | 2 | 39 | 199 | SR | 3 | 23 |
| 8 | SR | 0 | 72 | 72 | SR | 1 | 40 | 136 | SR | 2 | 40 | 200 | SR | 3 | 24 |
| 9 | SR | 0 | 73 | 73 | SR | 1 | 41 | 137 | SR | 2 | 41 | 201 | SR | 3 | 25 |
| 10 | SR | 0 | 74 | 74 | SR | 1 | 42 | 138 | SR | 2 | 42 | 202 | SR | 3 | 26 |
| 11 | SR | 0 | 75 | 75 | SR | 1 | 43 | 139 | SR | 2 | 43 | 203 | SR | 3 | 27 |
| 12 | SR | 0 | 76 | 76 | SR | 1 | 44 | 140 | SR | 2 | 44 | 204 | SR | 3 | 28 |
| 13 | SR | 0 | 77 | 77 | SR | 1 | 45 | 141 | SR | 2 | 45 | 205 | SR | 3 | 29 |
| 14 | SR | 0 | 78 | 78 | SR | 1 | 46 | 142 | SR | 2 | 46 | 206 | SR | 3 | 30 |
| 15 | SR | 0 | 79 | 79 | SR | 1 | 47 | 143 | SR | 2 | 47 | 207 | SR | 3 | 31 |
| 16 | SR | 0 | 80 | 80 | SR | 1 | 48 | 144 | SR | 2 | 48 | 208 | SR | −3 | 16 |
| 17 | SR | 0 | 81 | 81 | SR | 1 | 49 | 145 | SR | 2 | 49 | 209 | SR | −3 | 17 |
| 18 | SR | 0 | 82 | 82 | SR | 1 | 50 | 146 | SR | 2 | 50 | 210 | SR | −3 | 18 |
| 19 | SR | 0 | 83 | 83 | SR | 1 | 51 | 147 | SR | 2 | 51 | 211 | SR | −3 | 19 |
| 20 | SR | 0 | 84 | 84 | SR | 1 | 52 | 148 | SR | 2 | 52 | 212 | SR | −3 | 20 |
| 21 | SR | 0 | 85 | 85 | SR | 1 | 53 | 149 | SR | 2 | 53 | 213 | SR | −3 | 21 |
| 22 | SR | 0 | 86 | 86 | SR | 1 | 54 | 150 | SR | 2 | 54 | 214 | SR | −3 | 22 |
| 23 | SR | 0 | 87 | 87 | SR | 1 | 55 | 151 | SR | 2 | 55 | 215 | SR | −3 | 23 |
| 24 | SR | 0 | 88 | 88 | SR | 1 | 56 | 152 | SR | 2 | 56 | 216 | SR | −3 | 24 |
| 25 | SR | 0 | 89 | 89 | SR | 1 | 57 | 153 | SR | 2 | 57 | 217 | SR | −3 | 25 |
| 26 | SR | 0 | 90 | 90 | SR | 1 | 58 | 154 | SR | 2 | 58 | 218 | SR | −3 | 26 |
| 27 | SR | 0 | 91 | 91 | SR | 1 | 59 | 155 | SR | 2 | 59 | 219 | SR | −3 | 27 |
| 28 | SR | 0 | 92 | 92 | SR | 1 | 60 | 156 | SR | 2 | 60 | 220 | SR | −3 | 28 |
| 29 | SR | 0 | 93 | 93 | SR | 1 | 61 | 157 | SR | 2 | 61 | 221 | SR | −3 | 29 |
| 30 | SR | 0 | 94 | 94 | SR | 1 | 62 | 158 | SR | 2 | 62 | 222 | SR | −3 | 30 |
| 31 | SR | 0 | 95 | 95 | SR | 1 | 63 | 159 | SR | 2 | 63 | 223 | SR | −3 | 31 |
| 32 | SR | 0 | 96 | 96 | SR | −1 | 32 | 160 | SR | −2 | 32 | 224 | SR | 4 | 8 |
| 33 | SR | 0 | 97 | 97 | SR | −1 | 33 | 161 | SR | −2 | 33 | 225 | SR | 4 | 9 |
| 34 | SR | 0 | 98 | 98 | SR | −1 | 34 | 162 | SR | −2 | 34 | 226 | SR | 4 | 10 |
| 35 | SR | 0 | 99 | 99 | SR | −1 | 35 | 163 | SR | −2 | 35 | 227 | SR | 4 | 11 |
| 36 | SR | 0 | 100 | 100 | SR | −1 | 36 | 164 | SR | −2 | 36 | 228 | SR | 4 | 12 |

TABLE 9-continued

8-bit table (Prefix=1)

| Offset | Mode | Value | Prefix | Offset | Mode | Value | Prefix | Offset | Mode | Value | Prefix | Offset | Mode | Value | Prefix |
|---|---|---|---|---|---|---|---|---|---|---|---|---|---|---|---|
| 37 | SR | 0 | 101 | 101 | SR | −1 | 37 | 165 | SR | −2 | 37 | 229 | SR | 4 | 13 |
| 38 | SR | 0 | 102 | 102 | SR | −1 | 38 | 166 | SR | −2 | 38 | 230 | SR | 4 | 14 |
| 39 | SR | 0 | 103 | 103 | SR | −1 | 39 | 167 | SR | −2 | 39 | 231 | SR | 4 | 15 |
| 40 | SR | 0 | 104 | 104 | SR | −1 | 40 | 168 | SR | −2 | 40 | 232 | SR | −4 | 8 |
| 41 | SR | 0 | 105 | 105 | SR | −1 | 41 | 169 | SR | −2 | 41 | 233 | SR | −4 | 9 |
| 42 | SR | 0 | 106 | 106 | SR | −1 | 42 | 170 | SR | −2 | 42 | 234 | SR | −4 | 10 |
| 43 | SR | 0 | 107 | 107 | SR | −1 | 43 | 171 | SR | −2 | 43 | 235 | SR | −4 | 11 |
| 44 | SR | 0 | 108 | 108 | SR | −1 | 44 | 172 | SR | −2 | 44 | 236 | SR | −4 | 12 |
| 45 | SR | 0 | 109 | 109 | SR | −1 | 45 | 173 | SR | −2 | 45 | 237 | SR | −4 | 13 |
| 46 | SR | 0 | 110 | 110 | SR | −1 | 46 | 174 | SR | −2 | 46 | 238 | SR | −4 | 14 |
| 47 | SR | 0 | 111 | 111 | SR | −1 | 47 | 175 | SR | −2 | 47 | 239 | SR | −4 | 15 |
| 48 | SR | 0 | 112 | 112 | SR | −1 | 48 | 176 | SR | −2 | 48 | 240 | EA | 0 | 1 |
| 49 | SR | 0 | 113 | 113 | SR | −1 | 49 | 177 | SR | −2 | 49 | 241 | EA | 256 | 1 |
| 50 | SR | 0 | 114 | 114 | SR | −1 | 50 | 178 | SR | −2 | 50 | 242 | EA | 512 | 1 |
| 51 | SR | 0 | 115 | 115 | SR | −1 | 51 | 179 | SR | −2 | 51 | 243 | EA | 768 | 1 |
| 52 | SR | 0 | 116 | 116 | SR | −1 | 52 | 180 | SR | −2 | 52 | 244 | EA | 1024 | 1 |
| 53 | SR | 0 | 117 | 117 | SR | −1 | 53 | 181 | SR | −2 | 53 | 245 | EA | 1280 | 1 |
| 54 | SR | 0 | 118 | 118 | SR | −1 | 54 | 182 | SR | −2 | 54 | 246 | EA | 1536 | 1 |
| 55 | SR | 0 | 119 | 119 | SR | −1 | 55 | 183 | SR | −2 | 55 | 247 | EA | 1792 | 1 |
| 56 | SR | 0 | 120 | 120 | SR | −1 | 56 | 184 | SR | −2 | 56 | 248 | EA | 2048 | 1 |
| 57 | SR | 0 | 121 | 121 | SR | −1 | 57 | 185 | SR | −2 | 57 | 249 | EA | 2304 | 1 |
| 58 | SR | 0 | 122 | 122 | SR | −1 | 58 | 186 | SR | −2 | 58 | 250 | EA | 2560 | 1 |
| 59 | SR | 0 | 123 | 123 | SR | −1 | 59 | 187 | SR | −2 | 59 | 251 | EA | 2816 | 1 |
| 60 | SR | 0 | 124 | 124 | SR | −1 | 60 | 188 | SR | −2 | 60 | 252 | EA | 3072 | 1 |
| 61 | SR | 0 | 125 | 125 | SR | −1 | 61 | 189 | SR | −2 | 61 | 253 | EA | 3328 | 1 |
| 62 | SR | 0 | 126 | 126 | SR | −1 | 62 | 190 | SR | −2 | 62 | 254 | EA | 3584 | 1 |
| 63 | SR | 0 | 127 | 127 | SR | −1 | 63 | 191 | SR | −2 | 63 | 255 | EA | 3840 | 1 |

TABLE 10

8-BIT TABLE, TRUNCATED HUFFMAN CODING

| | | |
|---|---|---|
| 00XXXXXX | SR | 0 |
| 010XXXXX | SR | +1 |
| 011XXXXX | SR | −1 |
| 100XXXXX | SR | +2 |
| 101XXXXX | SR | −2 |
| 1100XXXX | SR | +3 |
| 1101XXXX | SR | −3 |
| 11100XXX | SR | +4 |
| 11101XXX | SR | −4 |
| 11110000 | EA | 0 |
| 11110001 | EA | 256 |
| 11110010 | EA | 512 |
| 11110011 | EA | 768 |
| 11110100 | EA | 1024 |
| 11110101 | EA | 1280 |
| 11110110 | EA | 1536 |
| 11110111 | EA | 1792 |
| 11111000 | EA | 2048 |
| 11111001 | EA | 2304 |
| 11111010 | EA | 2560 |
| 11111011 | EA | 2816 |
| 11111100 | EA | 3072 |
| 11111101 | EA | 3328 |
| 11111110 | EA | 3584 |
| 11111111 | EA | 3840 |

TABLE 11

| | | | Number of entries in each table | | | | | | |
|---|---|---|---|---|---|---|---|---|---|
| Symbol | Code | Bits | 8 bits | 9 bits | 10 bits | 11 bits | 12 bits | 13 bits | 14 bits |
| 0 | 11 | 2 | 64 | 128 | 256 | 512 | 1024 | 2048 | 4096 |
| 1 | 101 | 3 | 32 | 64 | 128 | 256 | 512 | 1024 | 2048 |
| −1 | 100 | 3 | 32 | 64 | 128 | 256 | 512 | 1024 | 2048 |
| 2 | 011 | 3 | 32 | 64 | 128 | 256 | 512 | 1024 | 2048 |
| −2 | 010 | 3 | 32 | 64 | 128 | 256 | 512 | 1024 | 2048 |
| 3 | 0011 | 4 | 16 | 32 | 64 | 128 | 256 | 512 | 1024 |
| −3 | 0010 | 4 | 16 | 32 | 64 | 128 | 256 | 512 | 1024 |
| 4 | 00011 | 5 | 8 | 16 | 32 | 64 | 128 | 256 | 512 |
| −4 | 00010 | 5 | 8 | 16 | 32 | 64 | 128 | 256 | 512 |
| 5 | 000011 | 6 | | 8 | 16 | 32 | 64 | 128 | 256 |
| −5 | 000010 | 6 | | 8 | 16 | 32 | 64 | 128 | 256 |
| 6 | 0000011 | 7 | | | 8 | 16 | 32 | 64 | 128 |
| −6 | 0000010 | 7 | | | 8 | 16 | 32 | 64 | 128 |
| 7 | 00000011 | 8 | | | | 8 | 16 | 32 | 64 |
| −7 | 00000010 | 8 | | | | 8 | 16 | 32 | 64 |
| 8 | 000000011 | 9 | | | | | 8 | 16 | 32 |
| −8 | 000000010 | 9 | | | | | 8 | 16 | 32 |
| 9 | 0000000111 | 11 | | | | | | 4 | 8 |
| −9 | 0000000110 | 11 | | | | | | 4 | 8 |
| 10 | 0000000101 | 11 | | | | | | 4 | 8 |
| −10 | 0000000100 | 11 | | | | | | 4 | 8 |
| 11 | 0000000011 | 11 | | | | | | 4 | 8 |
| −11 | 0000000010 | 11 | | | | | | | 8 |
| 12 | 000000000111 | 13 | | | | | | | |
| −12 | 000000000110 | 13 | | | | | | | |
| 13 | 000000000101 | 13 | | | | | | | |

TABLE 11-continued

| | | | Number of entries in each table | | | | | | |
|---|---|---|---|---|---|---|---|---|---|
| Symbol | Code | Bits | 8 bits | 9 bits | 10 bits | 11 bits | 12 bits | 13 bits | 14 bits |
| −13 | 000000000100 | 13 | | | | | | | |
| 14 | 000000000011 | 13 | | | | | | | |
| −14 | 000000000010 | 13 | | | | | | | |
| | Total Huffman codes: | | 240 | 496 | 1008 | 2032 | 4080 | 8180 | 16368 |
| | Extended Absolute codes: | | 16 | 16 | 16 | 16 | 16 | 16 | 16 |
| | Total number of entries: | | 256 | 512 | 1024 | 2048 | 4096 | 8196 | 16384 |

TABLE 12

| Prefix | Data size | Data value | Prefix | Data size | Data value |
|---|---|---|---|---|---|
| 0 | (init. codes) | n/a | 64 | 6 | 0 |
| 1 | 0 | | 65 | 6 | 1 |
| 2 | 1 | 0 | 66 | 6 | 2 |
| 3 | 1 | 1 | 67 | 6 | 3 |
| 4 | 2 | 0 | 68 | 6 | 4 |
| 5 | 2 | 1 | 69 | 6 | 5 |
| 6 | 2 | 2 | 70 | 6 | 6 |
| 7 | 2 | 3 | 71 | 6 | 7 |
| 8 | 3 | 0 | 72 | 6 | 8 |
| 9 | 3 | 1 | 73 | 6 | 9 |
| 10 | 3 | 2 | 74 | 6 | 10 |
| 11 | 3 | 3 | 75 | 6 | 11 |
| 12 | 3 | 4 | 76 | 6 | 12 |
| 13 | 3 | 5 | 77 | 6 | 13 |
| 14 | 3 | 6 | 78 | 6 | 14 |
| 15 | 3 | 7 | 79 | 6 | 15 |
| 16 | 4 | 0 | 80 | 6 | 16 |
| 17 | 4 | 1 | 81 | 6 | 17 |
| 18 | 4 | 2 | 82 | 6 | 18 |
| 19 | 4 | 3 | 83 | 6 | 19 |
| 20 | 4 | 4 | 84 | 6 | 20 |
| 21 | 4 | 5 | 85 | 6 | 21 |
| 22 | 4 | 6 | 86 | 6 | 22 |
| 23 | 4 | 7 | 87 | 6 | 23 |
| 24 | 4 | 8 | 88 | 6 | 24 |
| 25 | 4 | 9 | 89 | 6 | 25 |
| 26 | 4 | 10 | 90 | 6 | 26 |
| 27 | 4 | 11 | 91 | 6 | 27 |
| 28 | 4 | 12 | 92 | 6 | 28 |
| 29 | 4 | 13 | 93 | 6 | 29 |
| 30 | 4 | 14 | 94 | 6 | 30 |
| 31 | 4 | 15 | 95 | 6 | 31 |
| 32 | 5 | 0 | 96 | 6 | 32 |
| 33 | 5 | 1 | 97 | 6 | 33 |
| 34 | 5 | 2 | 98 | 6 | 34 |
| 35 | 5 | 3 | 99 | 6 | 35 |
| 36 | 5 | 4 | 100 | 6 | 36 |
| 37 | 5 | 5 | 101 | 6 | 37 |
| 38 | 5 | 6 | 102 | 6 | 38 |
| 39 | 5 | 7 | 103 | 6 | 39 |
| 40 | 5 | 8 | 104 | 6 | 40 |
| 41 | 5 | 9 | 105 | 6 | 41 |
| 42 | 5 | 10 | 106 | 6 | 42 |
| 43 | 5 | 11 | 107 | 6 | 43 |
| 44 | 5 | 12 | 108 | 6 | 44 |
| 45 | 5 | 13 | 109 | 6 | 45 |
| 46 | 5 | 14 | 110 | 6 | 46 |
| 47 | 5 | 15 | 111 | 6 | 47 |
| 48 | 5 | 16 | 112 | 6 | 48 |
| 49 | 5 | 17 | 113 | 6 | 49 |
| 50 | 5 | 18 | 114 | 6 | 50 |
| 51 | 5 | 19 | 115 | 6 | 51 |
| 52 | 5 | 20 | 116 | 6 | 52 |
| 53 | 5 | 21 | 117 | 6 | 53 |
| 54 | 5 | 22 | 118 | 6 | 54 |
| 55 | 5 | 23 | 119 | 6 | 55 |
| 56 | 5 | 24 | 120 | 6 | 56 |
| 57 | 5 | 25 | 121 | 6 | 57 |
| 58 | 5 | 26 | 122 | 6 | 58 |
| 59 | 5 | 27 | 123 | 6 | 59 |
| 60 | 5 | 28 | 124 | 6 | 60 |
| 61 | 5 | 29 | 125 | 6 | 61 |
| 62 | 5 | 30 | 126 | 6 | 62 |
| 63 | 5 | 31 | 127 | 6 | 63 |

TABLE 13

PREFIX TABLE ALLOCATION

| | Data carried | | |
|---|---|---|---|
| Prefix | No. of bits | Value | Table referenced |
| 0 | 0 | none | 7-bit tables |
| 1 | 0 | none | 8-bit table |
| 2–3 | 1 | 0–1 | 9-bit table |
| 4–7 | 2 | 0–3 | 10-bit table |
| 8–15 | 3 | 0–7 | 11-bit table |
| 16–31 | 4 | 0–15 | 12-bit table |
| 32–63 | 5 | 0–31 | 13-bit table |
| 64–127 | 6 | 0–63 | 14-bit table |

TABLE 14

| Leaf level | Bits left | Prefix table | Prefix range | Multi pixel |
|---|---|---|---|---|
| 0 | 0 | 8-bit | 1 | 0 |
| 1 | 1 | 9-bit | 2–3 | 0 |
| 2 | 2 | 10-bit | 4–7 | 0 |
| 3 | 3 | 11-bit | 8–15 | 0 |
| 4 | 4 | 12-bit | 16–31 | 0 |
| 5 | 5 | 13-bit | 32–63 | 0 |
| 6 | 6 | 14-bit | 64–127 | 0 |
| 7 | 7 | 7-bit | 0 | 1 |
| 8 | 8 | 8-bit | 1 | 1 |
| 9 | 9 | 9-bit | 2–3 | 1 |
| 10 | 10 | 10-bit | 4–7 | 1 |
| 11 | 11 | 11-bit | 8–15 | 1 |
| 12 | 12 | 12-bit | 16–31 | 1 |
| 13 | 13 | 13-bit | 32–63 | 1 |

What is claimed is:

1. A device for decoding unaligned variable length code words comprising:

(a) input means for receiving an input data stream; said data stream comprising a plurality of fixed-length data fragments; said data fragments collectively forming a plurality of variable-length code words arranged adjacently in said data stream; each of said code words being encoded from a source symbol according to a predefined relationship; and (b) code translation means including:

(i) means for defining a plurality of sequential operational cycles including a current cycle and at least one previously occurring cycle and at least one subsequently occurring cycle;

(ii) means for decoding a data fragment of said data stream, said data fragment including at least a portion of a current code word; and (iii) means for generating during said current cycle a residual word representing but not identical to at least a portion of a code word to be decoded in a subsequent cycle;

said means for decoding said data fragment producing a source symbol corresponding to said current code word responsive exclusively to said current code word portion of said data fragment and to a residual word generated in a previous cycle.

2. A device for decoding unaligned variable-length code words comprising:
  (a) input means for receiving input data words; said input data words containing adjacently arranged variable-length code words;
  (b) means for selecting at least one fixed length data token from said input data words; said token containing at least a portion of a current code word; said token optionally containing at least a portion of an adjacent code word;
  (c) decoding means for receiving said fixed length data token and for producing responsive thereto a source symbol corresponding to said current code word and a residual prefix word carrying information about the length and content of said portion of said adjacent code word if such adjacent code word is present; and
  (d) means for storing unaltered at least one residual prefix word produced previously by said decoding means;
  wherein said decoding means is further responsive to said stored but otherwise unaltered residual prefix word.

3. A device for decoding unaligned variable-length code words comprising:
  (a) means for defining a plurality of sequential operational cycles including a current cycle and at least one previously occurring cycle and at least one subsequently occurring cycle;
  (b) input means for receiving input data words; said input data words containing adjacently arranged variable-length code words;
  (c) means for selecting at least one fixed length data token from said input data words; said token containing at least a portion of a current code word to be decoded in said current cycle; said token optionally containing at least a portion of a subsequent code word to be decoded in said subsequent cycle;
  (d) decoding means for receiving said token and for producing responsive thereto a source symbol corresponding to said current code word and a residual prefix word carrying information about the length and content of said portion of said subsequent code word if such portion of said subsequent code word is present; and
  (e) means for storing unaltered at least one residual prefix word produced by said decoding means in said previous cycle;
  wherein said decoding means is further responsive to said stored but otherwise unaltered residual prefix word.

4. A device for decoding unaligned variable-length code words comprising:
  (a) means for receiving in sequence a plurality of fixed-length data tokens; said plurality of tokens collectively forming a data stream including a plurality of adjacently arranged variable-length code words; and
  (b) decoding means for decoding each of said variable-length code words into a corresponding source symbol; said decoding means comprising:
    (i) means for selecting one of said tokens; said token containing at least a portion of a current code word; said token optionally containing at least a portion of an adjacent code word;
    (ii) code translation means responsive to said portion of said current code word and to a previously generated residual word for producing the source symbol corresponding to said current code word; and
    (iii) means for generating a residual word responsive at least to said portion of said adjacent code word, said residual word being representative of, but not identical to, said portion of said adjacent code word.

5. The device of claim 4 wherein said token contains sufficient information to decode at least two of said code words.

6. The device of claim 4 wherein:
  said data stream includes at least one fixed length data word; and
  said device further comprises means for modifying the source symbol produced by said code translation means according to the contents of said fixed length data word.

7. A device for decoding unaligned variable-length code words comprising:
  (a) means for defining a plurality of sequential operational cycles including a current cycle and at least one previously occurring cycle and at least one subsequently occurring cycle;
  (b) input means for receiving a plurality of fixed length data words, each data word comprising at least two adjacently arranged fixed length data tokens;
  (c) means for selecting at least one of said data tokens for processing during said current cycle;
  (d) storage means for storing in an unaltered form at least one prefix word produced in said previous cycle; and
  (e) code table memory means connected for receiving said data token from said selecting means and for receiving said stored prefix word from said storage means in an unaltered form;
  said code table memory being responsive to said data token and said stored prefix word for producing a source symbol corresponding to a first portion of said data token;
  said code table memory being further responsive to said data token and said stored prefix word for producing a new prefix word for use during said subsequent cycle in processing an optional remaining portion of said data token;
  said prefix word containing information as to the length and contents of a code word associated with said optional remaining portion of said data token.

* * * * *